United States Patent
Huang et al.

(10) Patent No.: US 10,651,225 B2
(45) Date of Patent: May 12, 2020

(54) BAND-PASS FILTER FOR STACKED SENSOR

(71) Applicant: Taiwan Semiconductor Manufacturing Co., Ltd., Hsin-Chu (TW)

(72) Inventors: Cheng Yu Huang, Hsinchu (TW); Chun-Hao Chuang, Hsinchu (TW); Chien-Hsien Tseng, Hsinchu (TW); Kazuaki Hashimoto, Zhubei (TW); Keng-Yu Chou, Kaohsiung (TW); Wei-Chieh Chiang, Yuanlin Township (TW); Wen-Hau Wu, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/163,908

(22) Filed: Oct. 18, 2018

(65) Prior Publication Data

US 2020/0105815 A1    Apr. 2, 2020

Related U.S. Application Data

(60) Provisional application No. 62/737,321, filed on Sep. 27, 2018.

(51) Int. Cl.
*H01L 27/146* (2006.01)
*H01L 23/552* (2006.01)
(Continued)

(52) U.S. Cl.
CPC ...... *H01L 27/14643* (2013.01); *H01L 23/552* (2013.01); *H01L 23/64* (2013.01);
(Continued)

(58) Field of Classification Search
CPC ......... H01L 27/14643; H01L 27/14636; H01L 27/14632; H01L 27/14621; H01L 27/1469;
(Continued)

(56) References Cited

U.S. PATENT DOCUMENTS 9,184,198 B1 * 11/2015 Miao ................. H01L 27/14634
2015/0171146 A1    6/2015 Ooki et al.
(Continued)

OTHER PUBLICATIONS

Lyon et al. "Eyeing the Camera: Into the Next Century." Color and Imaging Conference, 10th Color and Imaging Conference Final Program and Proceedings, pp. 349-355(7). Published in 2002.
(Continued)

*Primary Examiner* — Dao H Nguyen
(74) *Attorney, Agent, or Firm* — Eschweiler & Potashnik, LLC

(57) ABSTRACT

In some embodiments, the present disclosure relates to a three-dimensional integrated chip. The three-dimensional integrated chip includes a first integrated chip (IC) die and a second IC die. The first IC die has a first image sensor element configured to generate electrical signals from electromagnetic radiation within a first range of wavelengths. The second IC die has a second image sensor element configured to generate electrical signals from electromagnetic radiation within a second range of wavelengths that is different than the first range of wavelengths. A first band-pass filter is arranged between the first IC die and the second IC die and is configured to reflect electromagnetic radiation that is within the first range of wavelengths.

20 Claims, 25 Drawing Sheets

(51) Int. Cl.
  *H01L 25/04* (2014.01)
  *H01L 23/64* (2006.01)
(52) U.S. Cl.
  CPC ........ *H01L 25/043* (2013.01); *H01L 27/1469* (2013.01); *H01L 27/14621* (2013.01); *H01L 27/14629* (2013.01); *H01L 27/14632* (2013.01); *H01L 27/14636* (2013.01)
(58) Field of Classification Search
  CPC . H01L 23/64; H01L 23/552; H01L 23/14629; H01L 25/043
  USPC ................ 257/431, 432, 437, 460, E27.122, 257/E31.001, E31.127; 438/70
  See application file for complete search history.

(56) References Cited

U.S. PATENT DOCUMENTS

| | | | |
|---|---|---|---|
| 2018/0149781 A1* | 5/2018 | Ockenfuss | G02B 5/207 |
| 2018/0158856 A1 | 6/2018 | Han et al. | |
| 2019/0110686 A1* | 4/2019 | Kato | A61B 1/00009 |
| 2019/0115386 A1* | 4/2019 | Ma | H01L 27/14636 |
| 2019/0189696 A1 | 6/2019 | Yamaguchi et al. | |

OTHER PUBLICATIONS www.wikipedia.org. "Foveon X3 Sensor." The page was last edited on Oct. 1, 2018.

* cited by examiner

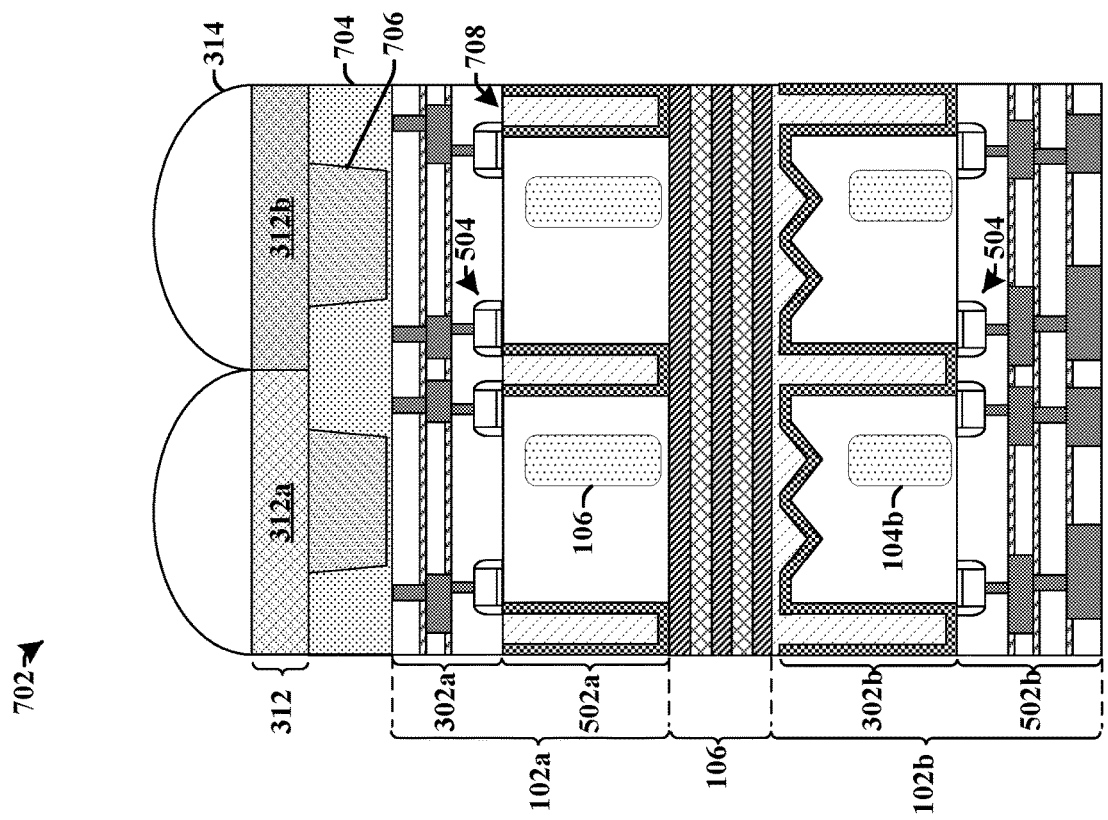
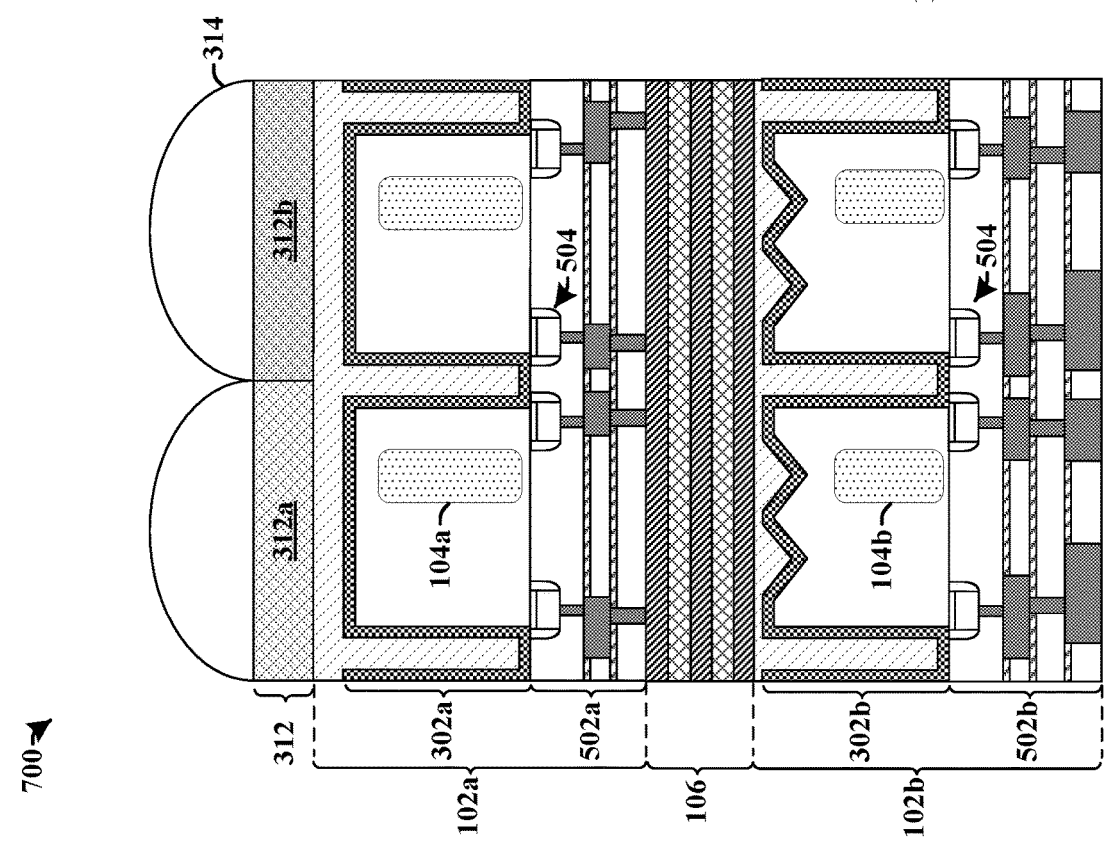

BAND-PASS FILTER FOR STACKED SENSOR

REFERENCE TO RELATED APPLICATION

This Application claims priority to U.S. Provisional Application No. 62/737,321, filed on Sep. 27, 2018, the contents of which are hereby incorporated by reference in their entirety.

BACKGROUND

Integrated circuits (IC) with image sensors are used in a wide range of modern day electronic devices. In recent years, complementary metal-oxide semiconductor (CMOS) image sensors have begun to see widespread use, largely replacing charge-coupled devices (CCD) image sensors. Compared to CCD image sensors, CMOS image sensors are increasingly favored due to low power consumption, a small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7C illustrate cross-sectional views of some embodiments of stacked image sensor devices having different sensor configurations incorporated with an inter-substrate band-pass filter.

DETAILED DESCRIPTION

Figure 1:
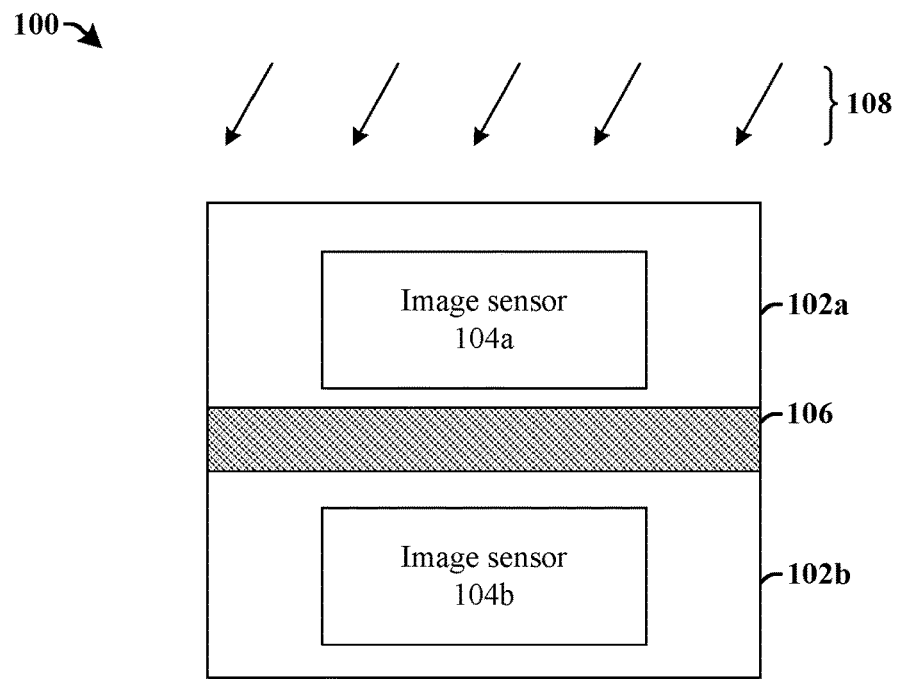
FIG. 1 illustrates a block diagram of some embodiments of a stacked image sensor device comprising an inter-substrate band-pass filter.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In recent years, three-dimensional integrated chips (3DICs) have begun to see widespread use in the semiconductor industry. 3DICs are manufactured by stacking multiple integrated chip die on top of one another. The stacked integrated chip die are electrically interconnected using through-substrate-vias (TSVs) that vertically extend through an integrated chip die. By vertically interconnecting the integrated chip die, the stacked integrated chip die behave as a single integrated chip device.

CMOS (complementary metal-oxide-semiconductor) image sensors may be formed on an image sensor die, which can be integrated into 3DICs. Typically, image sensor die are stacked onto integrated chip die having logic and/or memory. However, multiple image sensor die can also be stacked in a 3DIC, resulting in vertically stacked arrays of image sensor elements. Generally, light that is provided to such a stacked image sensor device comprises a wide range of colors having different wavelengths. The depth to which the light penetrates into a semiconductor material is a function of wavelength. Therefore, when image sensor die are stacked onto one another, different wavelengths of the spectrum of light can be separated (i.e., filtered) by placing image sensors that are sensitive to different colors at different heights of the 3DIC.

However, the spectral sensitivity of each image sensor element (e.g., photodiode) spans a range of wavelengths. Therefore, to effectively separate the different wavelengths of light based upon penetration depth, thicknesses of the image sensor die are made to be relatively thick. However, as the thicknesses of the image sensor die increases, the cross-talk between laterally adjacent sensors and vertically adjacent devices (e.g., spectral cross-talk) may also increase. This is because light entering a stacked image sensor device at an angle may travel a large lateral distance over large thicknesses and thereby reach laterally adjacent sensors. Moreover, while increasing thicknesses of the image sensor die effectively separates the different wavelengths of light, it also increases a sensitivity of image sensors within the die to wider ranges of wavelengths of light. The increase in cross-talk degrades a quality of an image captured by a CMOS image sensor (CIS) integrated chip by causing light that is intended for one pixel to be undesirably sensed by another pixel.

The present disclosure, in some embodiments, relates to a stacked image sensor device comprising an inter-substrate band-pass filter configured to reduce cross-talk between adjacent image sensor elements. The stacked image sensor device comprises a first substrate having a first image sensor element stacked onto a second substrate having a second image sensor element. The first image sensor element is configured to generate electrical signals from electromagnetic radiation within a first range of wavelengths. The second image sensor element is configured to generate electrical signals from electromagnetic radiation within a second range of wavelengths. A band-pass filter is arranged between the first and second substrates. The band-pass filter is configured to pass electromagnetic radiation within a passband including the second range of wavelengths while reflecting electromagnetic radiation including the first range of wavelengths. By reflecting electromagnetic radiation including the first range of wavelengths, a length of a path of electromagnetic radiation in the first substrate can be increased. By increasing the length of the path of electromagnetic radiation in the first substrate, the thickness of the first substrate can be decreased to decrease cross-talk within the stacked image sensor device without decreasing absorption of the electromagnetic radiation.

FIG. 1 illustrates a block diagram of some embodiments of a stacked image sensor device 100 comprising an inter-substrate band-pass filter.

The stacked image sensor device 100 comprises a first IC (integrated chip) die 102a having a first image sensor element 104a stacked onto a second IC die 102b having a second image sensor element 104b. The first image sensor element 104a and the second image sensor element 104b are configured to convert electromagnetic radiation 108 (e.g., photons) into electric signals (i.e., to generate electron-hole pairs from the electromagnetic radiation 108). The first image sensor element 104a is configured to generate electrical signals from electromagnetic radiation 108 within a first range of wavelengths, while the second image sensor element 104b is configured to generate electrical signals from electromagnetic radiation 108 within a second range of wavelengths that is different than the first range. For example, the first image sensor element 104a may be configured to generate electrical signals from visible light (i.e., electromagnetic radiation with wavelengths in a range of between approximately 400 nm and approximately 700 nm), while the second image sensor element 104b may be configured to generate electrical signals from infrared light (i.e., electromagnetic radiation with wavelengths in a range of between approximately 700 nm and approximately 1 mm).

A band-pass filter 106 is arranged between the first IC die 102a and the second IC die 102b. The band-pass filter 106 is configured to pass electromagnetic radiation 108 within a passband including the second range of wavelengths, while reflecting electromagnetic radiation 108 outside of the passband and including the first range of wavelengths. For example, the band-pass filter 106 may pass infrared light (i.e., electromagnetic radiation with wavelengths of in a range of between approximately 700 nm and approximately 1 mm), while reflecting electromagnetic radiation that is not infrared light (i.e., electromagnetic radiation having wavelengths smaller than 700 nm and greater than 1 mm).

By reflecting electromagnetic radiation 108 having wavelengths included in the first range of wavelengths, a path of the electromagnetic radiation that propagates within the first IC die 102a is lengthened without affecting the path of electromagnetic radiation outside of the first range of wavelengths. By lengthening a path of the electromagnetic radiation within the first IC die 102a, the first image sensor element 104a is able to absorb more radiation and thereby improve a quantum efficiency (QE) of the first image sensor element 104a. Furthermore, lengthening the path of the electromagnetic radiation that propagates within the first IC die 102a allows for a thickness of the first IC die 102a to be reduced, and thereby decreases cross-talk between adjacent image sensor elements in the first IC die 102a.

Figure 2:
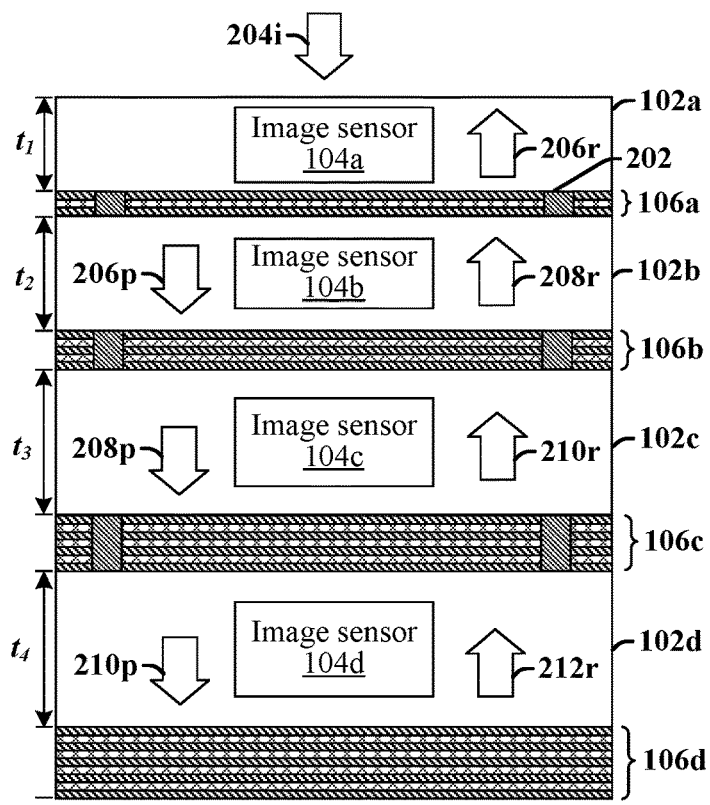
FIG. 2 illustrates a cross-sectional view of some additional embodiments of a stacked image sensor device comprising an inter-substrate band-pass filter.

FIG. 2 illustrates some additional embodiments of a cross-sectional view of a stacked image sensor device 200 comprising inter-substrate band-pass filters.

The stacked image sensor device 200 includes a plurality of stacked IC die 102a-102d comprising a plurality of image sensor elements 104a-104d. The plurality of stacked IC die 102a-102d are electrically connected by way of one or more conductive interconnect layers 202 (e.g., metal wires, vias, through-substrate-vias, or the like). The plurality of image sensor elements 104a-104d are configured to generate electrical signals in response to different wavelengths of electromagnetic radiation. In some embodiments, the plurality of stacked IC die 102a-102d may comprise semiconductor substrates (e.g., silicon substrates, germanium substrates, or the like). In some embodiments, the plurality of image sensor elements 104a-104d may comprise photodetectors, photodiodes, charge coupled devices, or the like.

In some embodiments, the stacked image sensor device 200 comprises a first IC die 102a having a first image sensor element 104a, a second IC die 102b having a second image sensor element 104b, a third IC die 102c having a third image sensor element 104c, and a fourth IC die 102d having a fourth image sensor element 104d. The first image sensor element 104a may be configured to detect blue light (e.g., light that has a wavelength between approximately 450 nm and approximately 490 nm). The second image sensor element 104b may be configured to detect green light (e.g., light that has a wavelength between approximately 520 nm and approximately 560 nm). The third image sensor element 104c may be configured to detect red light (e.g., light that has a wavelength between approximately 635 nm and approximately 700 nm). The fourth image sensor element 104d may be configured to detect infrared light (e.g., light that has a wavelength between approximately 700 nm and approximately 1 mm).

The plurality of substrates 102a-102d are separated by a plurality of band-pass filters 106a-106c. For example, a first band-pass filter 106a is arranged between the first IC die 102a and the second IC die 102b, a second band-pass filter 106b is arranged between the second IC die 102b and the third IC die 102c, a third band-pass filter 106c is arranged between the third IC die 102c and the fourth IC die 102d, and a fourth band-pass filter 106d is arranged below the fourth IC die 102d.

During operation, incident light 204*i* strikes a top of the first IC die 102*a*. The incident light 204*i* includes electromagnetic radiation spanning the electromagnetic spectrum (e.g., electromagnetic radiation having wavelengths from approximately 1 mm to approximately 10 nm). The incident light 204*i* interacts with the first image sensor element 104*a*. The first band-pass filter 106*a* is configured to receive the incident light 204*i*, and to pass light 206*p* having a wavelength that is greater than a first value (e.g., greater than approximately 490 nm) to the second IC die 102*b* while reflecting light 206*r* that has a wavelength of less than the first value back to the first IC die 102*a* (where the reflected light 206*r* can be further absorbed by the first image sensor element 104*a*). The second band-pass filter 106*b* is configured to pass light 208*p* having a wavelength that is greater than a second value (e.g., approximately 560 nm) to the third IC die 102*c* while reflecting light 208*r* that has a wavelength of less than the second value back to the second IC die 102*b* (where the reflected light 208*r* can be further absorbed by the second image sensor element 104*b*). The third band-pass filter 106*c* is configured to pass light 210*p* having a wavelength that is greater than a third value (e.g., approximately 700 nm) to the fourth IC die 102*d* while reflecting light 210*r* that has a wavelength of less than the third value back to the third IC die 102*c* (where the reflected light 210*r* can be further absorbed by the third image sensor element 104*c*). The fourth band-pass filter 106*d* is configured to reflect light 212*r* having a wavelength of greater than a fourth value (e.g., approximately 600 nm) back to the fourth IC die 102*d* (where the reflected light 212*r* can be further absorbed by the fourth image sensor element 104*d*)

In some embodiments, the plurality of IC die 102*a*-102*d* may comprise semiconductor substrates having different thicknesses. In some embodiments, the plurality of IC die 102*a*-102*d* may comprise semiconductor substrates having thicknesses that monotonically increase from the first IC die 102*a* to the fourth IC die 102*d*. For example, the first IC die 102*a* may have a first semiconductor substrate with a first thickness $t_1$, the second IC die 102*b* may have a second semiconductor substrate with a second thickness $t_2 > t_1$, the third IC die 102*c* may have a third semiconductor substrate with a third thickness $t_3 > t_2$, and the fourth IC die 102*d* may have a fourth semiconductor substrate with a fourth thickness $t_4 > t_3$.

By arranging the band-pass filters 106*a*-106*d* between the plurality of IC die 102*a*-102*d*, the thicknesses of the semiconductor substrates are able to be reduced while still effectively separating the spectrum of light in a vertical distance. Furthermore, using the band-pass filters 106*a*-106*b* to separate the spectrum of light in the vertical direction also reduces cross-talk of the image sensor elements 104*a*-104*d*. For example, in some embodiments the first image sensor 104*a* may be sensitive to blue light, the second image sensor 104*b* may be sensitive to green light, and the third image sensor 104*c* may be sensitive to red light. In such embodiments, the second image sensor 104*b* will not be sensitive to blue light when a first semiconductor substrate of the first IC die 102*a* is sufficiently thick. However, if the first semiconductor substrate 102*a* is sufficiently thick to prevent the second image sensor 104*b* from being sensitive to blue light, the first image sensor 104*a* may be sensitive to green and red light. Therefore, it is difficult to improve cross-talk of both the first image sensor 104*a* and the second image sensor 104*b* by tuning thicknesses of the first semiconductor substrate and/or a second semiconductor substrate of the second IC die 102*b*. Because the first band-pass filter 106*a* reflects blue light back to the first image sensor 104*a*, a path length of the blue light increases without increasing path lengths of green and red light. This causes the second image sensor 104*b* to not be sensitive to blue light even with a thinner first semiconductor substrate. It also causes the first image sensor 104*a* to not be sensitive to green and red light, and thus reduces cross-talk of both the first image sensor 104*a* and the second image sensor 104*b*.

Figure 3:
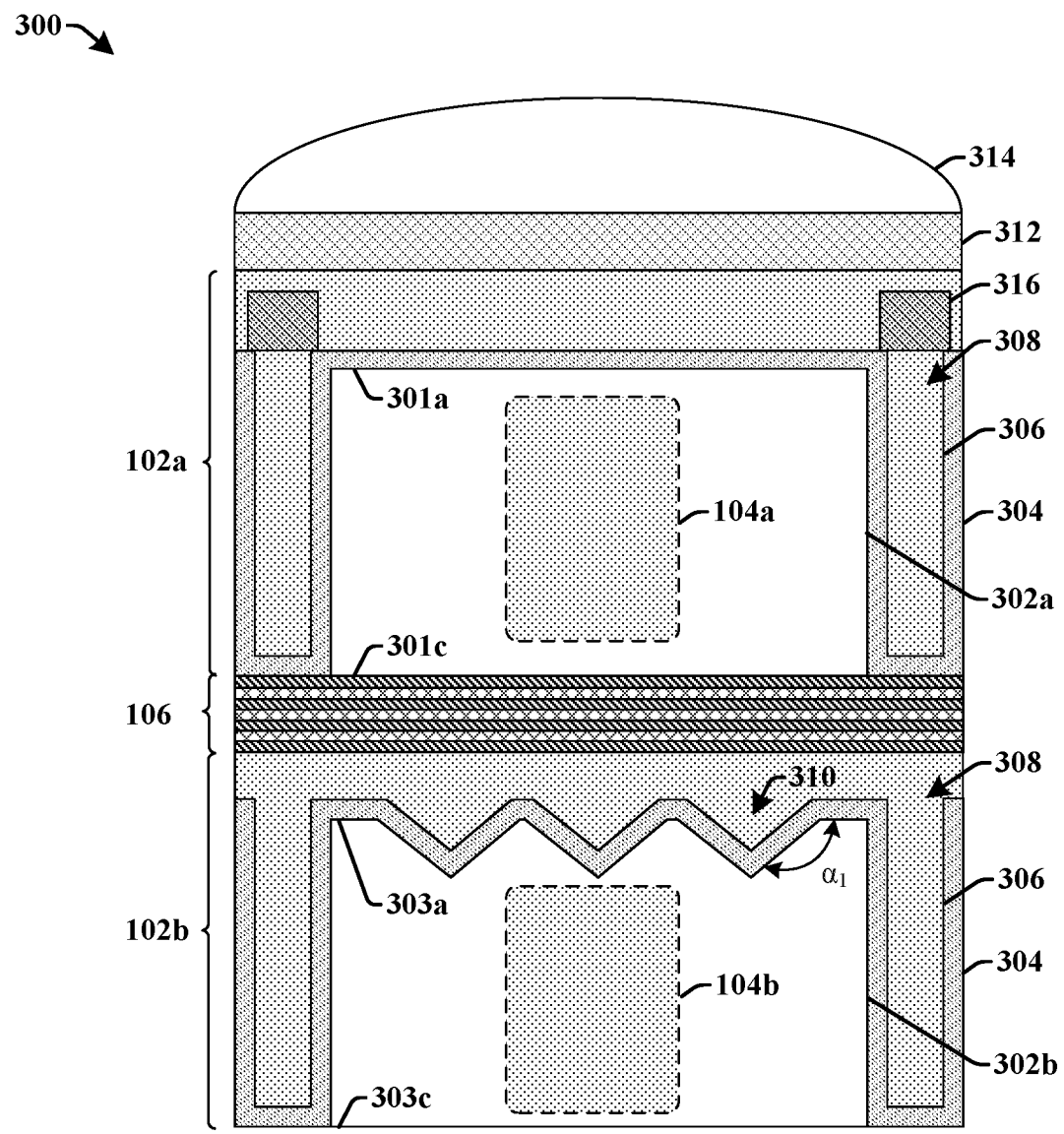
FIG. 3 illustrates a cross-sectional view of some additional embodiments of a stacked image sensor device comprising an inter-substrate band-pass filter.

FIG. 3 illustrates a cross-sectional view of some additional embodiments of a stacked image sensor device 300 comprising an inter-substrate band-pass filter.

The stacked image sensor device 300 comprises a first IC die 102*a* and a second IC die 102*b* separated by a band-pass filter 106. The first IC die 102*a* comprises a first image sensor element 104*a* and the second IC die 102*b* comprises a second image sensor element 104*b*. In some embodiments, the first IC die 102*a* is stacked onto the second IC die 102*b* so that the first image sensor element 104*a* is directly over the second image sensor element 104*b*. In other embodiments (not shown), the first IC die 102*a* is stacked onto the second IC die 102*b* so that the first image sensor element 104*a* is laterally offset from the second image sensor element 104*b*.

The first IC die 102*a* comprises a first substrate 302*a* having a first side 301*a* and a second side 301*c*. In some embodiments, the first side 301*a* may be a front-side of the first substrate 302*a* and the second side 301*c* may be a back-side of the first substrate 302*a*. In other embodiments, the first side 301*a* may be a back-side and the second side 301*c* may be a front-side. Interior surfaces of the first substrate 302*a* define one or more trenches extending within the first side 301*a* of the first substrate 302*a* on opposing sides of the first image sensor element 104*a*. The one or more trenches are filled with one or more dielectric layers 304-306 to define deep trench isolation (DTI) structures 308. In various embodiments, the first dielectric layer 304 may include a high-k dielectric material and the second dielectric layer 306 may include an oxide (e.g., silicon dioxide), a nitride (e.g., silicon nitride), or the like.

The second IC die 102*b* comprises a second substrate 302*b* having a first side 303*a* and a second side 303*c*. In some embodiments, the first side 303*a* may be a front-side of the second substrate 302*b* and the second side 303*c* may be a back-side of the second substrate 302*b*. In other embodiments, the first side 303*a* may be a back-side and the second side 303*c* may be a front-side. Interior surfaces of the second substrate 302*b* define one or more trenches extending within the second substrate 302*b* on opposing sides of the second image sensor element 104*b*. The one or more trenches are filled with the one or more dielectric layers 304-306 to define one or more DTI structures 308 within the second substrate 302*b*. In some embodiments, the first side 303*a* of the second substrate 302*b* may have angled surfaces defining one or more recesses 310 configured to reduce reflection of radiation from the first side 303*a* of the second substrate 302*b*. In some embodiment, the angled surfaces defining the one or more recesses 310 can form an angle $\alpha_1$ in a range of between approximately 45° and approximately 55° with respect to the second side 303*c* of the second substrate 302*b*. In some embodiments, the one or more recesses 310 can be arranged in a periodic pattern.

In some embodiments, reflective elements 316 may be arranged over the DTI structures 308 within the first substrate 302*a*. The reflective elements 316 are configured to increase internal reflection of light, so as to decrease the amount of backscattered light exiting out of the first substrate 302*a*. By increasing the internal reflection of light, the first substrate 302*a* is able to absorb more radiation, thereby increasing a quantum efficiency of the stacked image sensor device 300. In various embodiments, the reflective elements 316 may comprise a metal such as aluminum (Al), rhodium (Rh), iron (Fe), or the like. In other embodiments, the reflective elements 316 may comprise air gaps.

In some embodiments, a color filter 312 may be arranged over the first IC die 102*a*. In some such embodiments, the first image sensor element 104*a* may be sensitive to visible light (e.g., blue light), while the second image sensor element 104*b* may be sensitive to infrared light. The color filter 312 is configured to transmit specific wavelengths of visible light while blocking other wavelengths of visible light. In other embodiments, the color filter 312 may be omitted. A micro-lens 314 may be arranged over the first IC die 102*a*. During operation, the micro-lens 314 is configured to focus incident radiation (e.g., light) towards the first IC die 102*a*.

Figure 4:
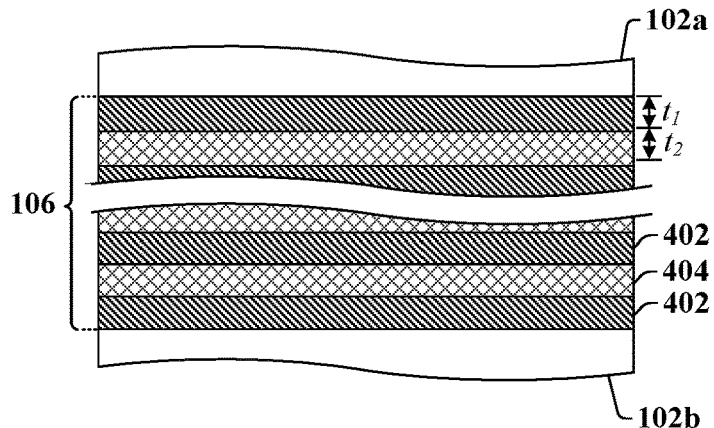
FIG. 4 illustrates a cross-sectional view of some embodiments of an inter-substrate band-pass filter.

FIG. 4 illustrates a cross-sectional view 400 of some embodiments of an inter-substrate band-pass filter.

As shown in cross-sectional view 400, a band-pass filter 106 comprises a multi-film structure having a plurality of stacked layers. The plurality of stacked layers comprise layers of a first material 402 and layers of a second material 404. The layers of the first material 402 and the layers of the second material 404 are stacked in periodically alternating order. For example, the band-pass filter 106 may comprise a layer of the first material 402, an overlying layer of the second material 404, an overlying layer of the first material 402, etc. In some embodiments, the band-pass filter 106 may have five or more layers of the first material 402 and four or more layers of the second material 404. If the band-pass filter has fewer layers of the first material 402 and the second material 404, the band-pass filter 106 may be unable to sufficiently filter incident radiation.

In some embodiments, the layers of the first material 402 have a first index of refraction and the layers of the second material 404 have a second index of refraction that is different than the first index of refraction. In some embodiments, the first index of refraction is less than the second index of refraction. For example, in some embodiments, the first index of refraction may be greater than 3 and the second index of refraction may be less than 3. In some additional embodiments, the first index of refraction may be in a first range of between approximately 3 and approximately 4, while the second index of refraction may be in a second range of between approximately 1 and approximately 2. In some embodiments, the layers of the first material 402 may comprise silicon and the layers of the second material 404 may comprise silicon dioxide.

In some embodiments, the layers of the first material 402 may have a first thickness $t_1$ and the layers of the second material 404 may have a second thickness $t_2$. In some embodiments, the first thickness $t_1$ is less than the second thickness $t_2$. In some embodiments, the first thickness $t_1$ may be in a range of between approximately 17 nm and approximately 170 nm. In some embodiments, the second thickness $t_2$ may be in a range of between approximately 30 nm and approximately 300 nm.

Figure 5:
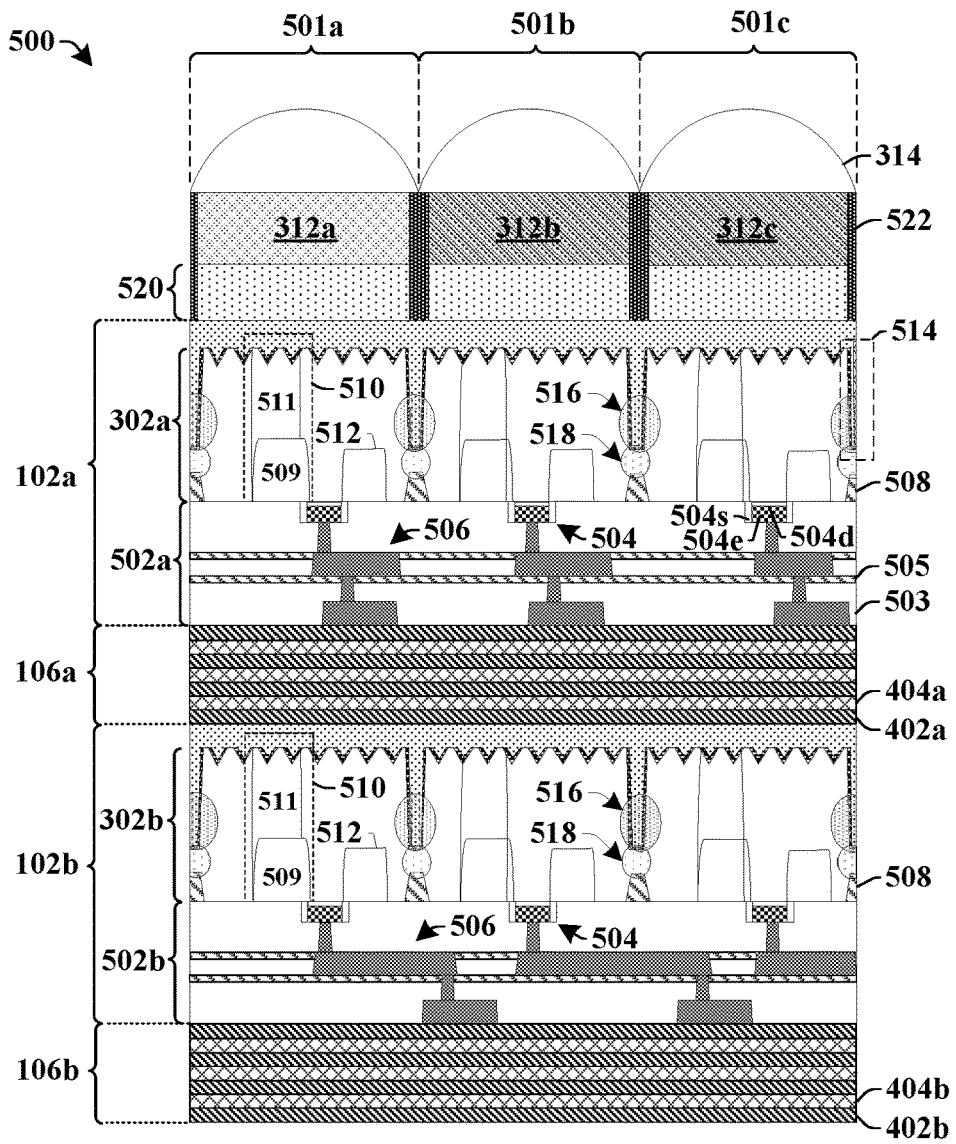
FIG. 5 illustrates a cross-sectional view of some additional embodiments of a stacked image sensor device comprising an inter-substrate band-pass filter.

FIG. 5 illustrates a cross-sectional view of some additional embodiments of a stacked image sensor device 500 comprising an inter-substrate band-pass filter.

The stacked image sensor device 500 comprises a first IC die 102*a* and a second IC die 102*b* separated by a first band-pass filter 106*a*. A second band-pass filter 106*b* is separated from the first IC die 102*a* by the second IC die 102*b*. The first band-pass filter 106*a* comprises alternating layers of a first material 402*a* having a first refractive index and layers of a second material 404*a* having a second refractive index that is less than the first refractive index. The second band-pass filter 106*b* comprises alternating layers of a third material 402*b* having a third refractive index and layers of a fourth material 404*b* having a fourth refractive index that is less than the third refractive index. In some embodiments, the layers of a first material 402*a* may be a same material as the layers of the third material 402*b* and the layers of the second material 404*a* may be a same material as the layers of the fourth material 404*b*. In other embodiments, the layers of a first material 402*a* may be a different material than the layers of the third material 402*b* and the layers of the second material 404*a* may be a different material than the layers of the fourth material 404*b*.

The first IC die 102*a* and the second IC die 102*b* respectively have a plurality of pixel regions 501*a*-501*c* comprising a photodiode 510. The first IC die 102*a* comprises a first substrate 302*a* and a first dielectric structure 502*a* disposed on the first substrate 302*a*. The second IC die 102*b* comprises a second substrate 302*b* and a second dielectric structure 502*b* disposed on the second substrate 302*b*.

The first dielectric structure 502*a* and the second dielectric structure 502*b* respectively comprise a plurality of stacked inter-level dielectric (ILD) layers 503 separated by etch stop layers 505. In various embodiments, the plurality of stacked inter-level dielectric (ILD) layers 503 may comprise one or more of an oxide (e.g., $SiO_2$, SiCO, etc.), a fluorosilicate glass, a phosphate glass (e.g., borophosphate silicate glass), etc. The plurality of stacked inter-level dielectric (ILD) layers 503 surround a plurality of conductive interconnect layers 506 (e.g., interconnect wires and vias) electrically coupled to transistor gate structures 504. In some embodiments, the plurality of conductive interconnect layers 506 may comprise one or more of copper, aluminum, tungsten, and carbon nanotubes, or the like.

The plurality of transistor gate structures 504 respectively comprise a gate electrode 504*e* arranged on a gate dielectric layer 504*d*. In some embodiments, sidewall spacers 504*s* are arranged on opposing sides of the gate electrode 504*e*. In some embodiments, a transistor gate structure 504 corresponding to a transfer transistor is laterally arranged between a photodiode 510 and a floating diffusion node 512 within the first IC die 102*a*. In such embodiments, the photodiode 510 may comprise a first region 509 having a first doping type (e.g., n-type doping) and an adjoining second region 511 within the first IC die 102*a* having a second doping type (e.g., p-type doping) that is different than the first doping type. The transistor gate structure 504 is configured to control the transfer of charge from the photodiode 510 to the floating diffusion node 512.

A plurality of shallow trench isolation (STI) structures 508 are also arranged within front-sides of the first substrate 302*a* and the second substrate 302*b*. The plurality of STI structures 508 comprise one or more dielectric materials (e.g., $SiO_2$) arranged within trenches. A plurality of backside deep trench isolation (BDTI) structures 514 are arranged within trenches within back-sides of the first substrate 302*a* and the second substrate 302*b* over the plurality of STI structures 508.

In some embodiments, one or more isolation well regions may be arranged between the STI structures 508 and the BDTI structures 514. The one or more isolation well regions may comprise deep-well regions 516 and/or cell-well regions 518 having one or more doping types that provide further isolation between adjacent pixel regions 501*a*-501*c* by way of junction isolation. The deep-well regions 516 are arranged in the first IC die 102*a* at a location laterally aligned with the STI structures 508 and/or the BDTI structures 514. The cell-well regions 518 are arranged in the first IC die 102a at a location vertically between the deep-well regions 516 and the STI structures 508.

In some embodiments, a dielectric planarization structure 520 may be arranged over the first IC die 102a. The dielectric planarization structure 520 has a substantially planar upper surface. In various embodiments, the dielectric planarization structure 520 may comprise one or more stacked dielectric materials. In some embodiments, the one or more stacked dielectric materials may comprise an oxide (e.g., $SiO_2$), a nitride, a carbide, or the like.

In some embodiments, a grid structure 522 is disposed over the dielectric planarization structure 520. The grid structure 522 comprises sidewalls that define openings overlying the pixel regions 501a-501c. In various embodiments, the grid structure 522 may comprise a metal (e.g., aluminum, cobalt, copper, silver, gold, tungsten, etc.) and/or a dielectric material (e.g., $SiO_2$, SiN, etc.). A plurality of color filters, 312a-312c, are arranged within the openings in the grid structure 522. The plurality of color filters, 312a-312c, are respectively configured to transmit specific wavelengths of incident radiation. In some embodiments, the plurality of color filters 312 comprise a first color filter 312a configured to transmit radiation having wavelengths within a first range (e.g., corresponding to green light), a second color filter 312b configured to transmit radiation having wavelengths within a second range (e.g., corresponding to red light) different than the first range, and a third color filter 312c configured to transmit radiation having wavelengths within a third range (e.g., corresponding to blue light) different than the first and second ranges. A plurality of micro-lenses 314 are arranged over the plurality of color filters 312a-312c. The plurality of micro-lenses 314 are configured to focus the incident radiation (e.g., light) towards the pixel regions 501a-501c.

In various embodiments, the disclosed band-pass filter may be arranged at different positions. FIGS. 6A-6D illustrates cross-sectional views of stacked integrated chip structures comprising band-pass filters at different positions. It will be appreciated that the stacked integrated chip structures illustrated in FIGS. 6A-6D are non-limiting embodiments, and that the disclosed band-pass filter may alternatively be arranged at other positions.

Figure 6B:
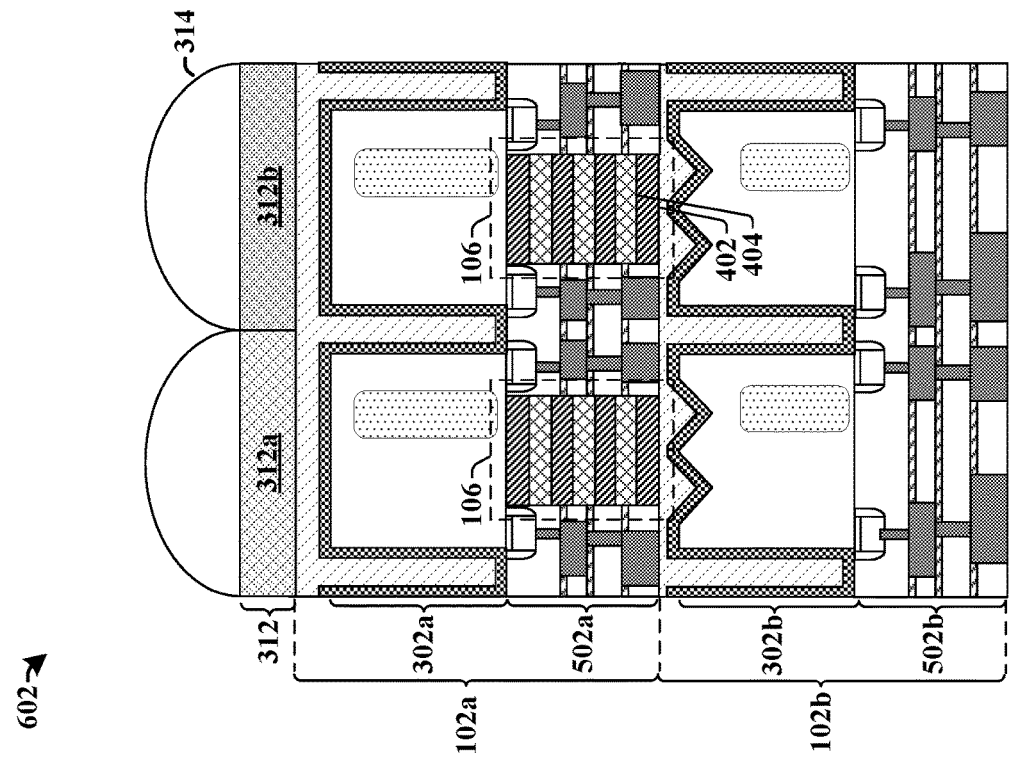
FIGS. 6A-6D illustrate cross-sectional views of some embodiments of stacked image sensor devices having different inter-substrate band-pass filter configurations.
Figure 6A:
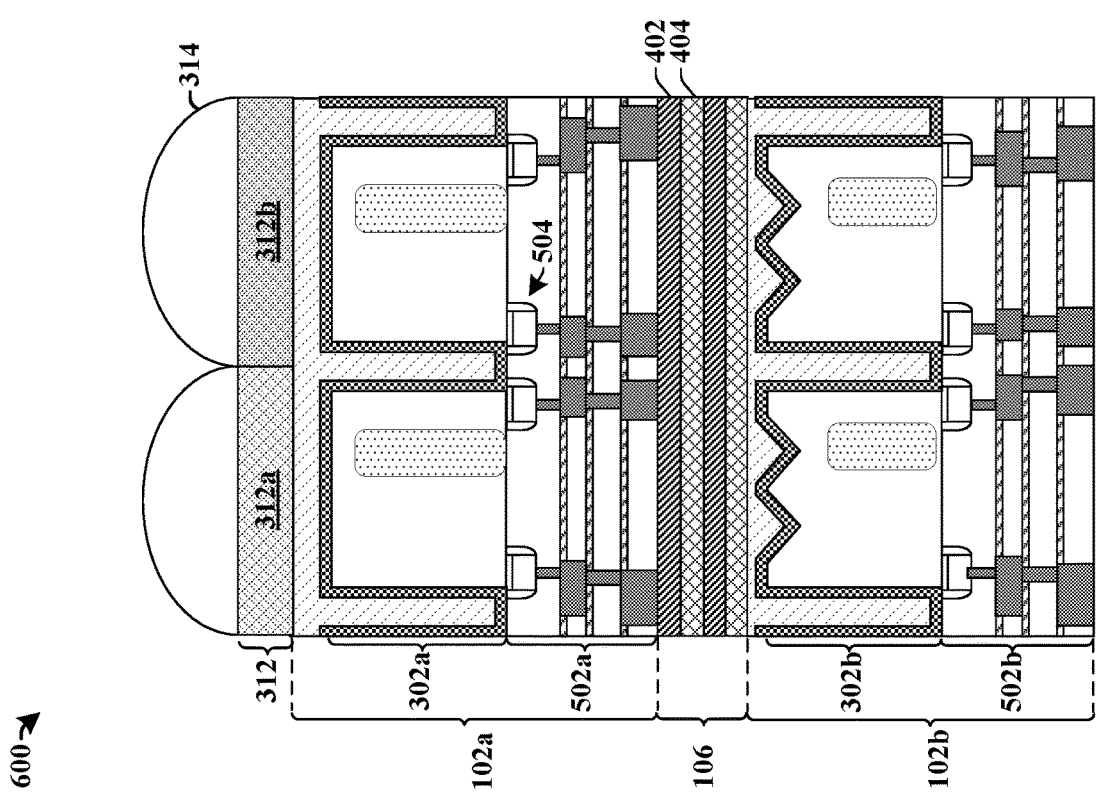

FIG. 6A illustrates a cross-sectional view of some additional embodiments of stacked image sensor device 600 comprising an inter-substrate band-pass filter.

The stacked image sensor device 600 comprises a first IC die 102a and a second IC die 102b. A first dielectric structure 502a is arranged along a front side of the first IC die 102a. The first dielectric structure 502a surrounds transistor gate structures 504 arranged along the front side of the first IC die 102a. A second dielectric structure 502b is also arranged along a front side of the second IC die 102b. The second dielectric structure 502b surrounds transistor gate structures 504 arranged along the front side of the second IC die 102b.

A band-pass filter 106 is arranged between the first dielectric structure 502a and the second IC die 102b. The band-pass filter 106 has a first side that contacts the first dielectric structure 502a (e.g., a passivation layer arranged along a top of the first dielectric structure 502a). The band-pass filter 106 has a second side that contacts the second IC die 102b. In some embodiments, the band-pass filter 106 is arranged completely below the first dielectric structure 502a.

FIG. 6B illustrates a cross-sectional view of some additional embodiments of stacked image sensor device 602 comprising an inter-substrate band-pass filter.

The stacked image sensor device 602 comprises a band-pass filter 106 that is embedded within the first dielectric structure 502a, so that the band-pass filter 106 is between sidewalls of the first dielectric structure 502a. In some embodiments, the band-pass filter 106 may have a height that is substantially equal to a height of the first dielectric structure 502a. In other embodiments, the band-pass filter 106 may have a height that is less than a height of the first dielectric structure 502a.

Figure 6D:
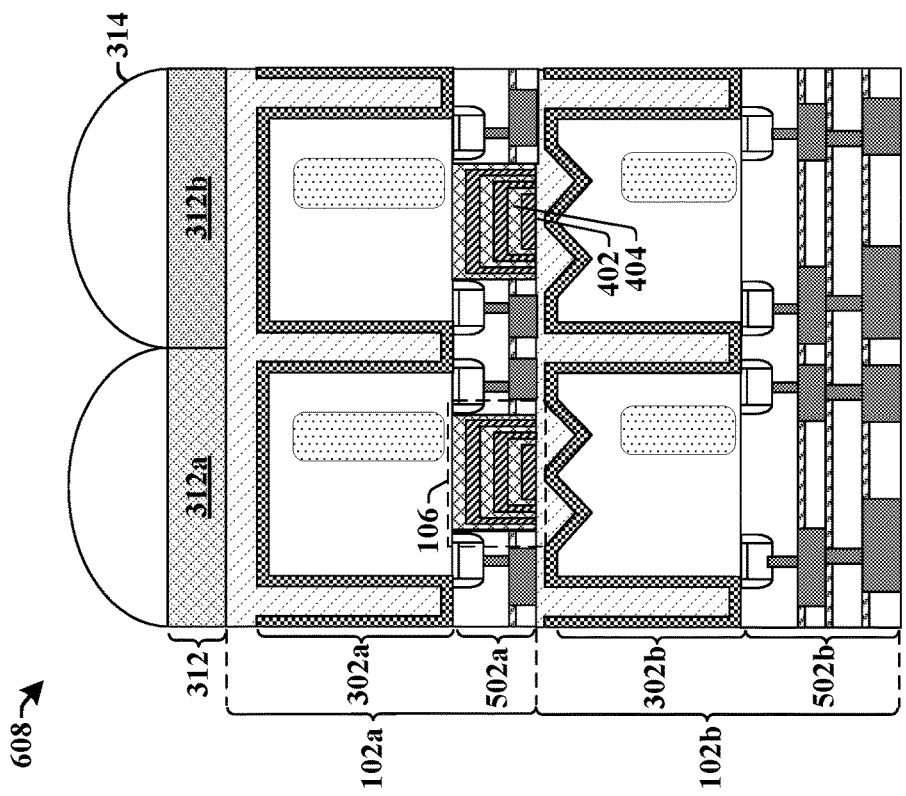
Figure 6C:
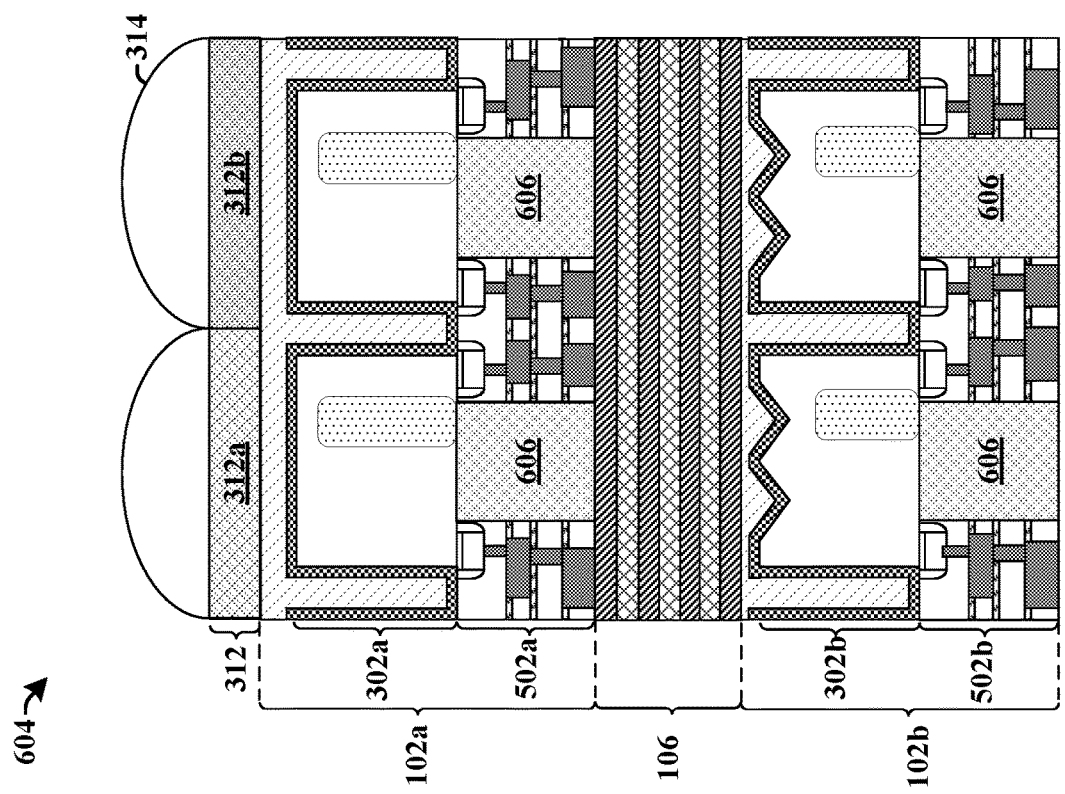

FIG. 6C illustrates a cross-sectional view of some additional embodiments of stacked image sensor device 604 comprising an inter-substrate band-pass filter.

The stacked image sensor device 604 comprises a waveguide 606 embedded within the first dielectric structure 502a, between sidewalls of the first dielectric structure 502a. In some embodiments, the waveguide 606 may have a height that is substantially equal to a height of the first dielectric structure 502a. The waveguide 606 comprises a dielectric material having a different (e.g., a lower) index of refraction than materials of the first dielectric structure 502a, so as to guide electromagnetic radiation within the waveguide 606 using internal reflection.

A band-pass filter 106 is arranged between the second IC die 102b and the first dielectric structure 502a and the waveguide 606. The band-pass filter 106 has a first side that contacts the first dielectric structure 502a (e.g., a passivation layer arranged along a top of the first dielectric structure 502a) and the waveguide 606. The band-pass filter 106 has a second side that contacts the second IC die 102b.

FIG. 6D illustrates a cross-sectional view of some additional embodiments of stacked image sensor device 608 comprising an inter-substrate band-pass filter.

The stacked image sensor device 608 comprises a band-pass filter 106 that is embedded within the first dielectric structure 502a between sidewalls of the first dielectric structure 502a. The band-pass filter 106 comprises a plurality of nested layers of materials, 402 and 404. The plurality of nested layers of materials, 402 and 404, vertically and laterally contact adjacent layers of materials on opposing sides. In some embodiments, the plurality of nested layers of materials, 402 and 404, may have greater thicknesses along horizontal surfaces than along vertical surfaces (e.g., sidewalls)

Figure 7C:
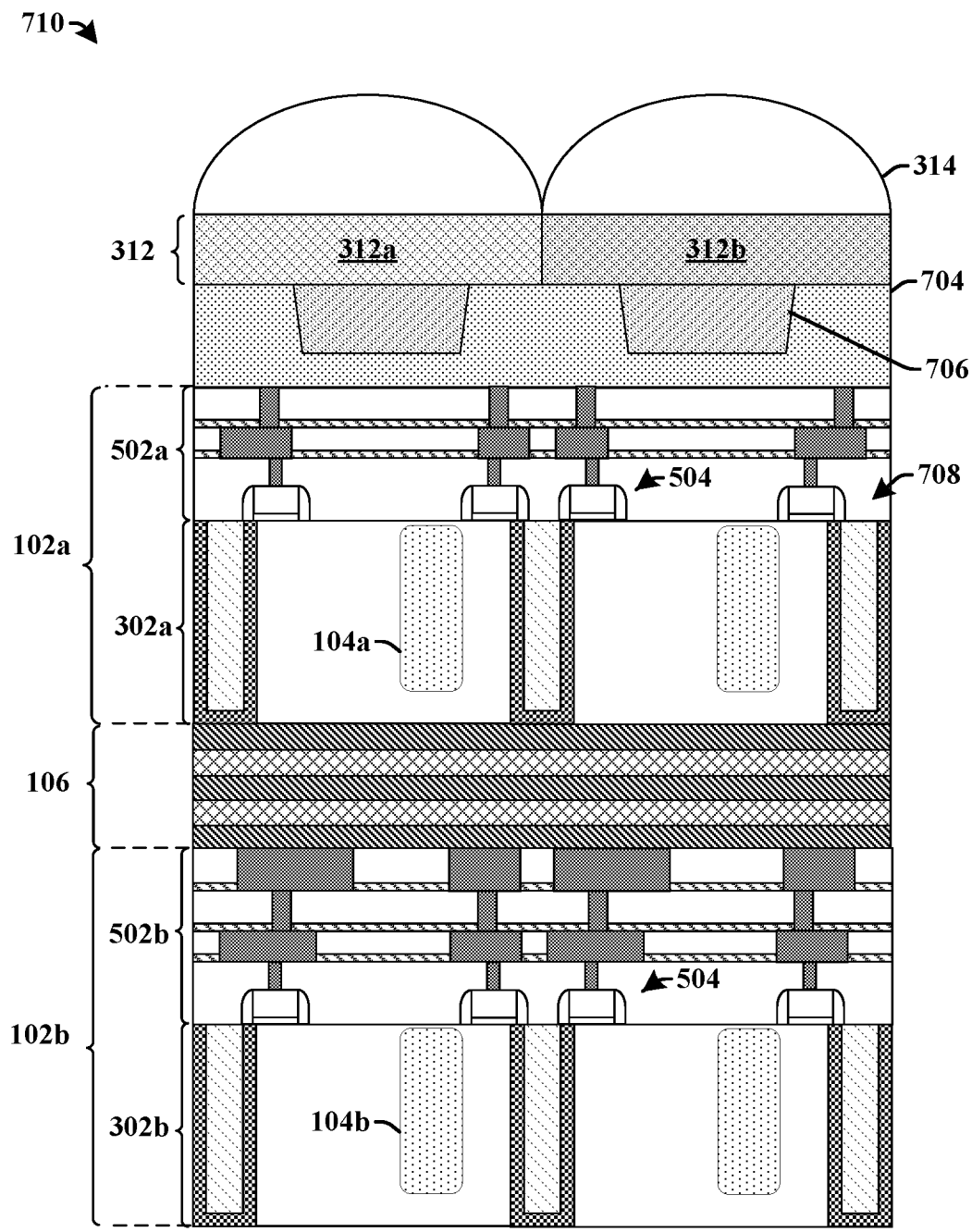

In various embodiments, the disclosed band-pass filter may be arranged between different combinations of front-side illuminated (FSI) image sensor die and back-side illuminated (BSI) image sensor die. FIGS. 7A-7C illustrates cross-sectional views of stacked integrated chip structures comprising different types of image sensor die. It will be appreciated that the stacked integrated chip structures illustrated in FIGS. 7A-7C are non-limiting embodiments.

FIG. 7A illustrates some embodiments of a stacked image sensor device 700 comprising an inter-substrate band-pass filter arranged between BSI image sensor die.

The stacked image sensor device 700 comprises a first IC die 102a stacked onto a second IC die 102b. The first IC die 102a comprises a front-side and a back-side configured to receive incident radiation. A plurality of transistor gate structures 504 are arranged along the front-side. The second IC die 102b comprises a front-side and a back-side configured to receive incident radiation. A plurality of transistor gate structures 504 are arranged along the front-side. A band-pass filter 106 is arranged between the front-side of the first IC die 102a and the back-side of the second IC die 102b.

FIG. 7B illustrates some embodiments of a stacked image sensor device 702 comprising an inter-substrate band-pass filter arranged between a FSI image sensor die and a BSI image sensor die.

The stacked image sensor device 702 comprises a first IC die 102a stacked onto a second IC die 102b. The first IC die 102a comprises a front-side configured to receive incident radiation and a back-side. A plurality of transistor gate structures 504 are arranged along the front-side. The second IC die 102b comprises a front-side and a back-side configured to receive incident radiation. A plurality of transistor gate structures 504 are arranged along the front-side. The band-pass filter 106 is arranged between the back-side of the first IC die 102a and the back-side of the second IC die 102b.

In some embodiments, an upper dielectric layer 704 is arranged over the first IC die 102a, and a waveguide 706 is embedded within the upper dielectric layer 704. The waveguide 706 comprises a dielectric material having a different (e.g., a lower) index of refraction than materials of the upper dielectric layer 704. The waveguide 706 has a bottom surface facing the first IC die 102a and a top surface facing away from the first IC die 102a. The bottom surface has a smaller width than the top surface.

FIG. 7C illustrate some embodiments of a stacked image sensor device 710 comprising an inter-substrate band-pass filter arranged between FSI image sensor dies.

The stacked image sensor device 710 comprises a first IC die 102a stacked onto a second IC die 102b. The first IC die 102a comprises a front-side configured to receive incident radiation and a back-side. A plurality of transistor gate structures 504 are arranged along the front-side. The second IC die 102b comprises a front-side configured to receive incident radiation and a back-side. A plurality of transistor gate structures 504 are arranged along the front-side. A band-pass filter 106 is arranged between a back-side of the first IC die 102a and a front-side of the second IC die 102b.

Figure 8A:
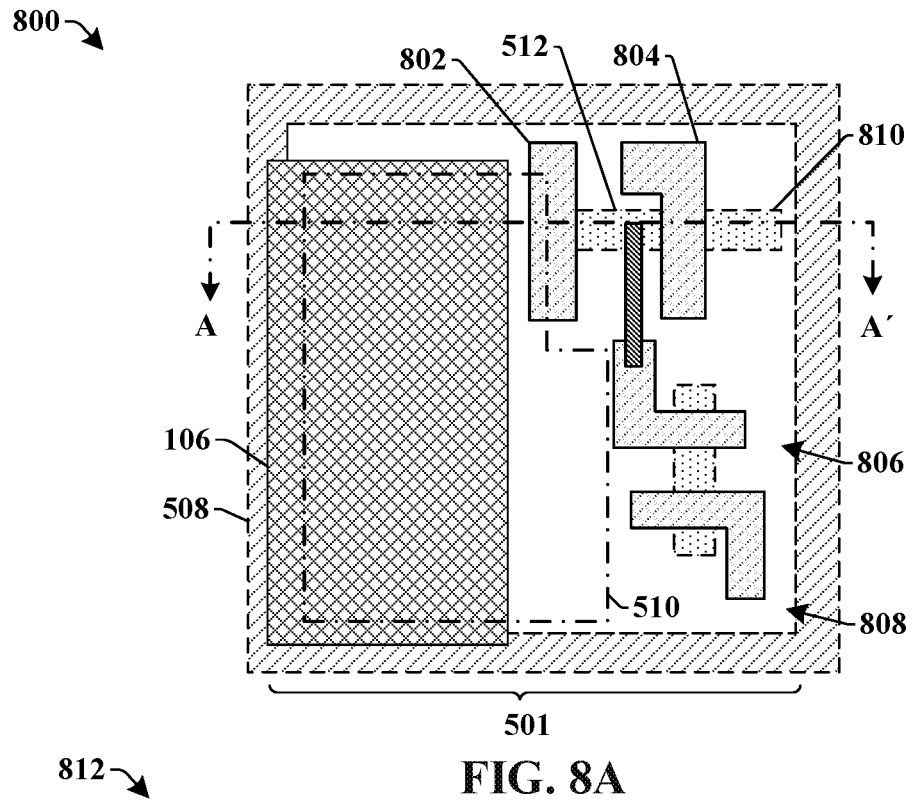
FIGS. 8A-8B illustrate some additional embodiments of a stacked image sensor device comprising an inter-substrate band-pass filter.
Figure 8B:
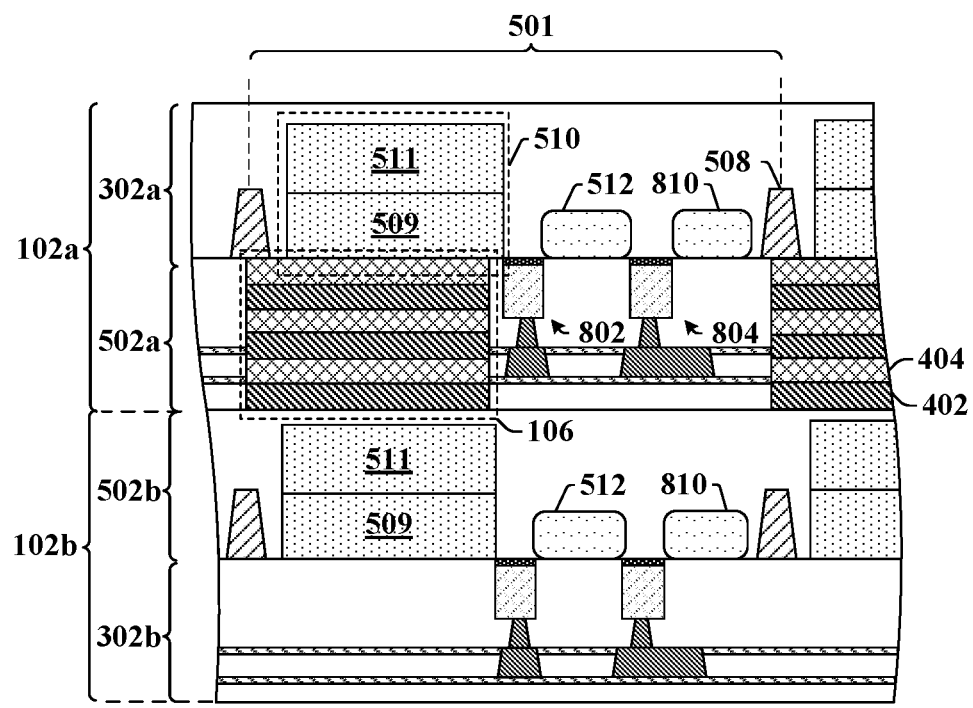

FIGS. 8A-8B illustrate some additional embodiments of a stacked image sensor device comprising an inter-substrate band-pass filter.

FIG. 8A illustrates a top-view 800 of a pixel region 501. FIG. 8B illustrates a cross-sectional view 812 along cross-sectional line A-A' of FIG. 8A. As shown in the cross-sectional view 812, the stacked image sensor device comprises a first IC die 102a stacked onto a second IC die 102b. A first gate structure 802 and a second gate structure 804 are arranged on the first IC die 102a. The first gate structure 802 is associated with a transfer transistor arranged between a photodiode 510 and a floating diffusion node 512. The second gate structure 804 is associated with a reset transistor arranged between the floating diffusion node 512 and a source/drain region 810.

As shown in top-view 800, an STI structure 508 extends around a pixel region 501 as a continuous structure. The pixel region 501 comprises the first gate structure 802, the second gate structure 804, a source-follower transistor 806, and a row-select transistor 808. The first gate structure 802 is arranged between a photodiode 510 and a floating diffusion node 512. The first gate structure 802 is configured to transfer charge accumulated in the photodiode 510 to the floating diffusion node 512. The second gate structure 804 is configured to clear charge stored at the floating diffusion node 512. The floating diffusion node 512 gates the source-follower transistor 806 that selectively couples a power source (not shown) to the row-select transistor 808. The row-select transistor 808 selectively couples the source-follower transistor 806. The source-follower transistor 806 is configured to non-destructively read and amplify charge stored in the floating diffusion node 512, and the row-select transistor 808 is configured to select the pixel region 501 for readout.

A band-pass filter 106 is arranged over the photodiode 510. In some embodiments, the band-pass filter 106 is disposed at a location that is outside of the first gate structure 802, the second gate structure 804, a source-follower transistor 806, and a row-select transistor 808. In other embodiments (not shown), the band-pass filter may cover an entirety of the pixel region 501.

Figure 9:
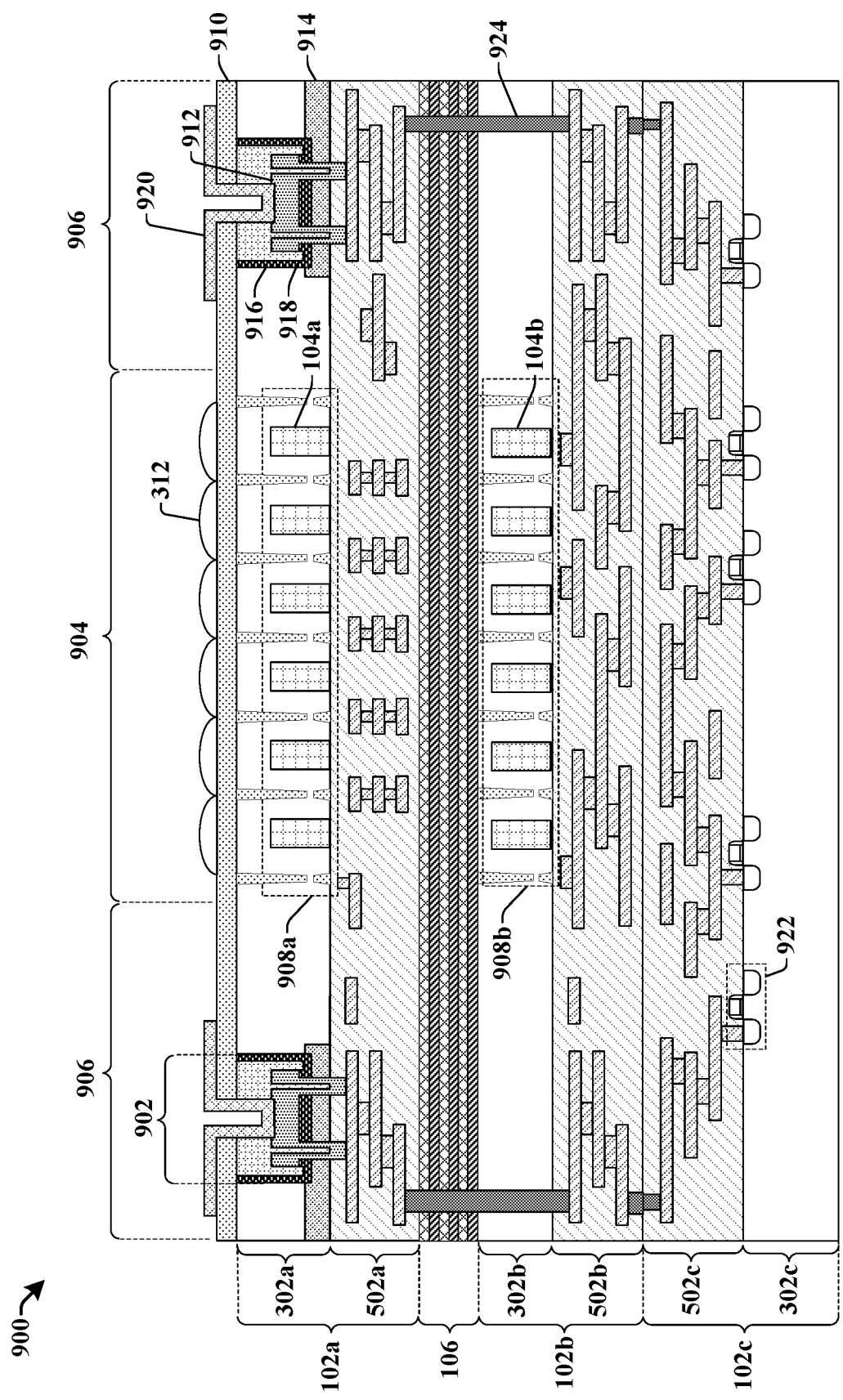
FIG. 9 illustrates a cross-sectional view of some embodiments of an integrated chip structure comprising a stacked image sensor device having an inter-substrate band-pass filter.

FIG. 9 illustrates a cross-sectional view of some embodiments of an integrated chip structure 900 comprising a stacked image sensor device having an inter-substrate band-pass filter.

The integrated chip structure 900 comprises a first IC die 102a, a second IC die 102b stacked onto the first IC die 102a, and a third IC die 102c stacked onto the second IC die 102b. The first IC die 102a comprises a first substrate 302a and a first dielectric structure 502a. A first array of image sensor elements 908a are arranged within the first substrate 302a in a sensing region 904. The first array of image sensor elements 908a comprises a first image sensor element 104a. A passivation layer 910 is arranged along a back-side of the first substrate 302a. An array of micro-lenses 312 are arranged over the passivation layer 910. A bonding region 906 laterally surrounds the sensing region 904 and comprises bond pads 912 that are configured to electrically couple the integrated chip structure 900 to external devices. In some embodiments, the bond pads 912 are arranged within a recess 902 in the first substrate 302a. In such embodiments, the recess 902 may be defined by sidewalls of the first substrate 302a and a lower dielectric layer 914. A dielectric liner 916 and a dielectric fill 918 may fill the recess 902. A conductive layer 920 extends from the bond pad 912 to over the first IC die 102a.

The second IC die 102b comprises a second substrate 302b and a second dielectric structure 502b. A second array of image sensor elements 908b are arranged within the second substrate 302b in the sensing region 904. The second array of image sensor elements 908b comprises a second image sensor element 104b. The second image sensor element 104b is configured to sense electromagnetic radiation at different wavelengths than the first image sensor element 104a.

The third IC die 102c comprises a plurality of transistor devices 922. In some embodiments, the transistor devices 922 are configured to perform processing of signals received from the first array of image sensor elements 908a and/or the second array of image sensor elements 908b. In some embodiments, the interconnect layers within the first dielectric structure 502a are coupled to interconnect layers within the second dielectric structure 502b by through-substrate-vias (TSVs) 924. In some embodiments, the TSVs 924 may extend through the band-pass filter 106. In other embodiments (not shown), the TSVs 924 may have outermost sidewalls that are separated from outermost sidewalls of the band-pass filter 106 by one or more non-zero distances.

FIGS. 10-26 illustrate cross-sectional views 1000-2600 of some embodiments of forming a stacked image sensor device comprising an inter-substrate band-pass filter. Although the cross-sectional views 1000-2600 shown in FIGS. 10-26 are described with reference to a method of forming a stacked image sensor device comprising an inter-substrate band-pass filter, it will be appreciated that the structures shown in FIGS. 10-26 are not limited to the method of formation but rather may stand alone separate of the method.

Figure 10:
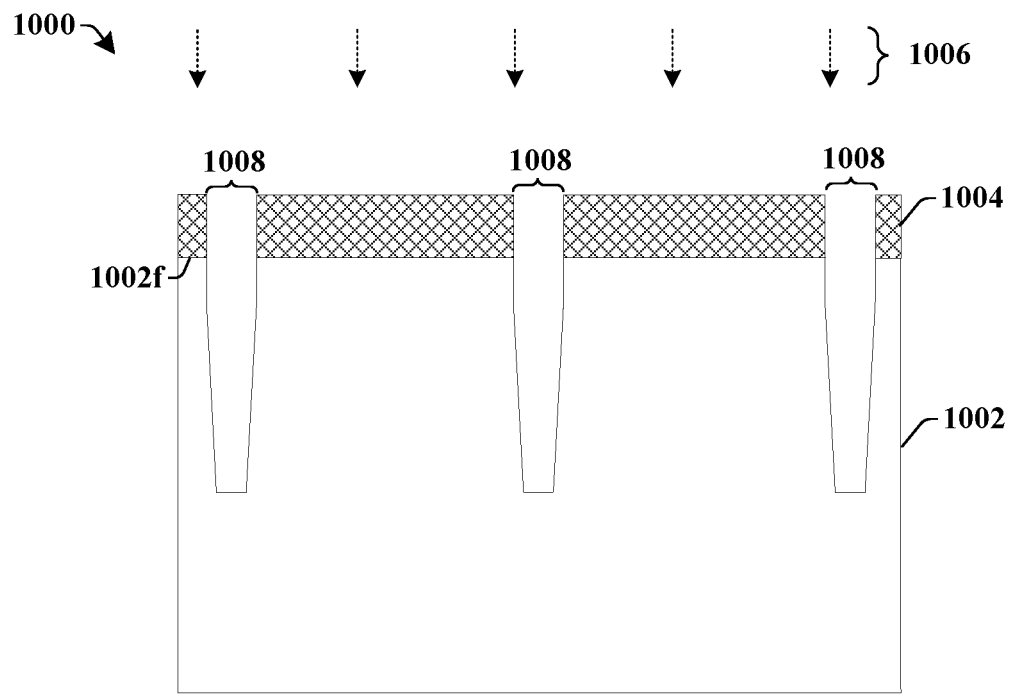
FIGS. 10-26 illustrate cross-sectional views of some embodiments of a method of forming a stacked image sensor device comprising an inter-substrate band-pass filter.

As shown in cross-sectional view 1000 of FIG. 10, a first etching process is performed on a front-side 1002f of a first substrate 1002 according to a first masking layer 1004. The first substrate 1002 may be any type of semiconductor body (e.g., silicon, SiGe, SOI, etc.), as well as any other type of semiconductor and/or epitaxial layers, associated therewith. The first etching process is performed by exposing unmasked regions of the first substrate 1002 to one or more etchants 1006, which remove parts of the first substrate 1002 in the unmasked regions to define trenches 1008 within the first substrate 1002.

Figure 11:
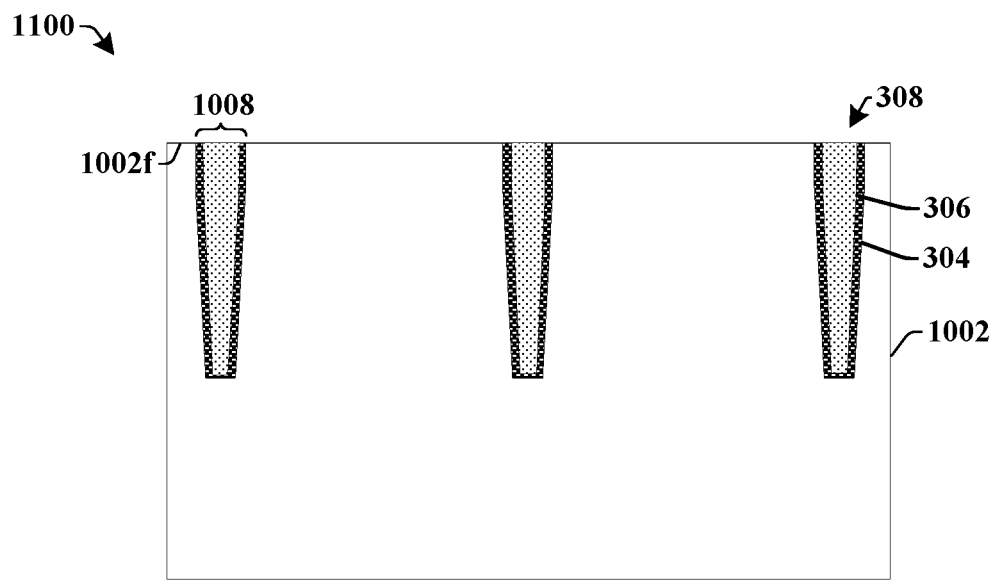

As shown in cross-sectional view 1100 of FIG. 11, one or more dielectric layers 304-306 are formed within the trenches 1008. A planarization process is subsequently performed to define deep trench isolation (DTI) structures 308 within the front-side 1002f of the first substrate 1002. The one or more dielectric layer 304-306 may comprise a first dielectric layer 304 and layers of a second dielectric layer 306. In some embodiments, the first dielectric layer 304 may comprise a high-k dielectric layer including hafnium oxide ($HfO_2$), titanium oxide ($TiO_2$), hafnium zirconium oxide (HfZrO), tantalum oxide ($Ta_2O_3$), hafnium silicon oxide ($HfSiO_4$), zirconium oxide ($ZrO_2$), zirconium silicon oxide ($ZrSiO_2$), or the like. In some embodiments, the second dielectric layer 306 may comprise an oxide (e.g., silicon oxide), TEOS, or the like. In some embodiments, the first dielectric layer 304 and the second dielectric layer 306 may be deposited by a deposition technique (e.g., PVD, CVD, PE-CVD, ALD, or the like).

Figure 12:
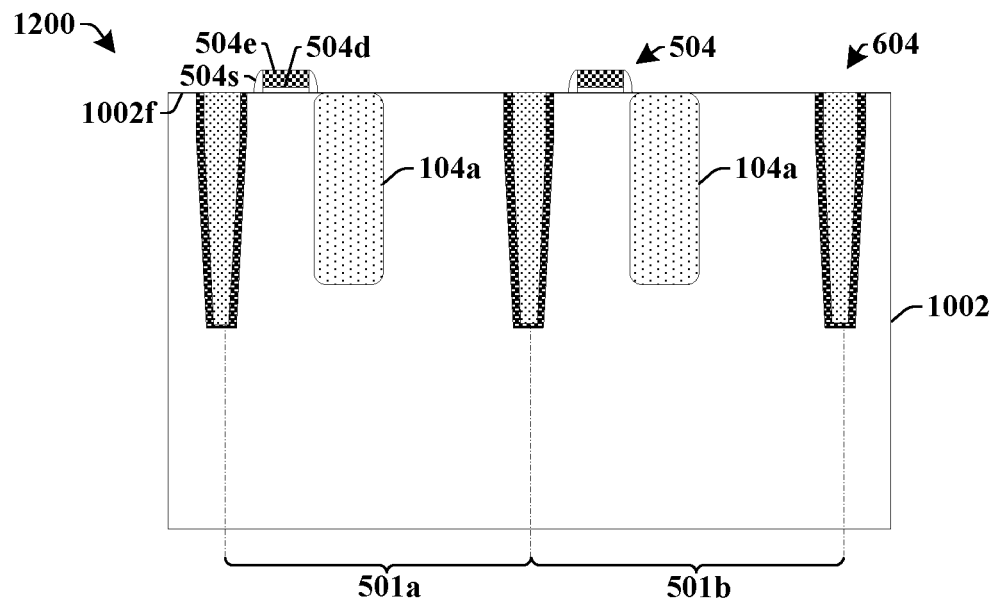

As shown in cross-sectional view 1200 of FIG. 12, a first image sensor element 104a is formed within pixel regions 501a-501b of the first substrate 1002. The first image sensor element 104a is configured to generate electrical signals in response to electromagnetic radiation having wavelengths within a first range. In some embodiments, the first image sensor element 104a may comprise a photodiode formed by implanting one or more dopant species into the front-side 1002f of the first substrate 1002. For example, the first image sensor element 104a may be formed by selectively performing a first implantation process (e.g., according to a masking layer) to form a first region having a first doping type (e.g., n-type), and subsequently performing a second implantation process to form a second region abutting the first region and having a second doping type (e.g., p-type) different than the first doping type.

One or more transistor gate structures 504 are formed along the front-side 1002f of the first substrate 1002 within the pixel regions 501a-501b. In various embodiments, the one or more transistor gate structures 504 may correspond to a transfer transistor, a source-follower transistor, a row select transistor, and/or a reset transistor. In some embodiments, the one or more transistor gate structures 504 may be formed by depositing a gate dielectric film and a gate electrode film on the front-side 1002f of the first substrate 1002. The gate dielectric film and the gate electrode film are subsequently patterned to form a gate dielectric layer 504d and a gate electrode 504e. Sidewall spacers 504s may be formed on the outer sidewalls of the gate electrode 504e. In some embodiments, the sidewall spacers 504s may be formed by depositing a spacer layer (e.g., a nitride, an oxide, etc.) onto the front-side 1002f of the first substrate 1002 and selectively etching the spacer layer to form the sidewall spacers 504s.

Figure 13:
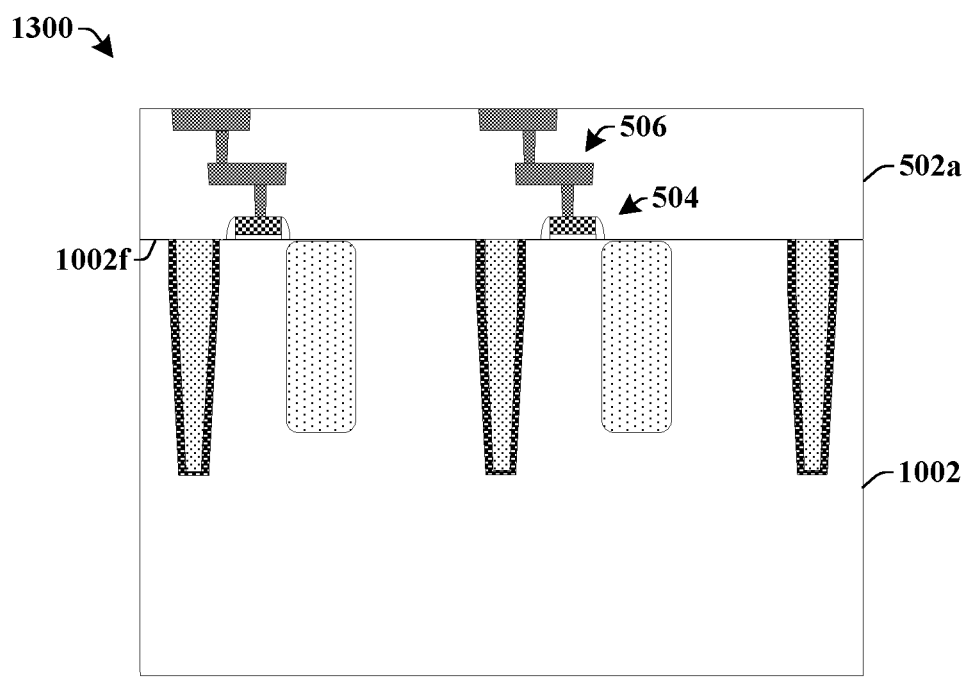

As shown in cross-sectional view 1300 of FIG. 13, a plurality of conductive interconnect layers 506 are formed within a first dielectric structure 502a formed along the front-side 1002f of the first substrate 1002. The first dielectric structure 502a comprises a plurality of stacked inter-level dielectric (ILD) layers, while the plurality of conductive interconnect layers 506 comprise alternating layers of conductive wires and vias. In some embodiments, one or more of the plurality of conductive interconnect layers 506 may be formed using a damascene process (e.g., a single damascene process or a dual damascene process). The damascene process is performed by forming an ILD layer over the first substrate 1002, etching the ILD layer to form a via hole and/or a metal trench, and filling the via hole and/or metal trench with a conductive material. In some embodiments, the ILD layer may be deposited by a deposition technique (e.g., PVD, CVD, PE-CVD, ALD, etc.) and the conductive material may be formed using a deposition process and/or a plating process (e.g., electroplating, electroless plating, etc.). In various embodiments, the plurality of conductive interconnect layers 506 may comprise tungsten, copper, or aluminum copper, or the like.

Figure 14:
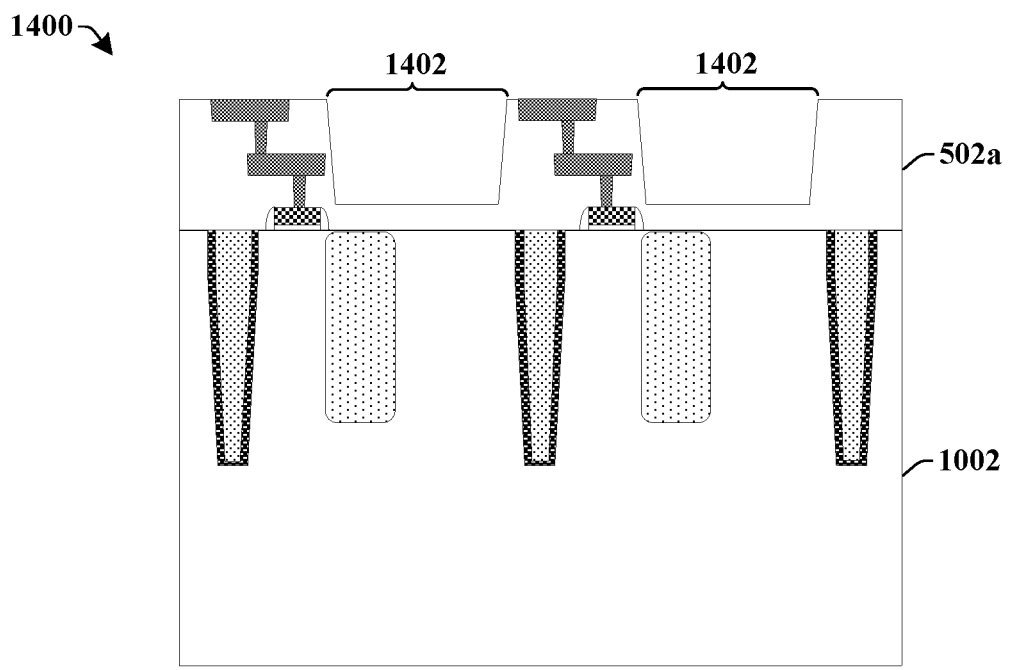

As shown in cross-sectional view 1400 of FIG. 14, a second etching process is performed on the first dielectric structure 502a. The second etching process defines waveguide openings 1402 extending through the first dielectric structure 502a. In some embodiments, the waveguide openings 1402 are arranged directly over the first image sensor element 104a. In some embodiments, the first dielectric structure 502a is selectively etched according to a second masking layer (not shown).

Figure 15:
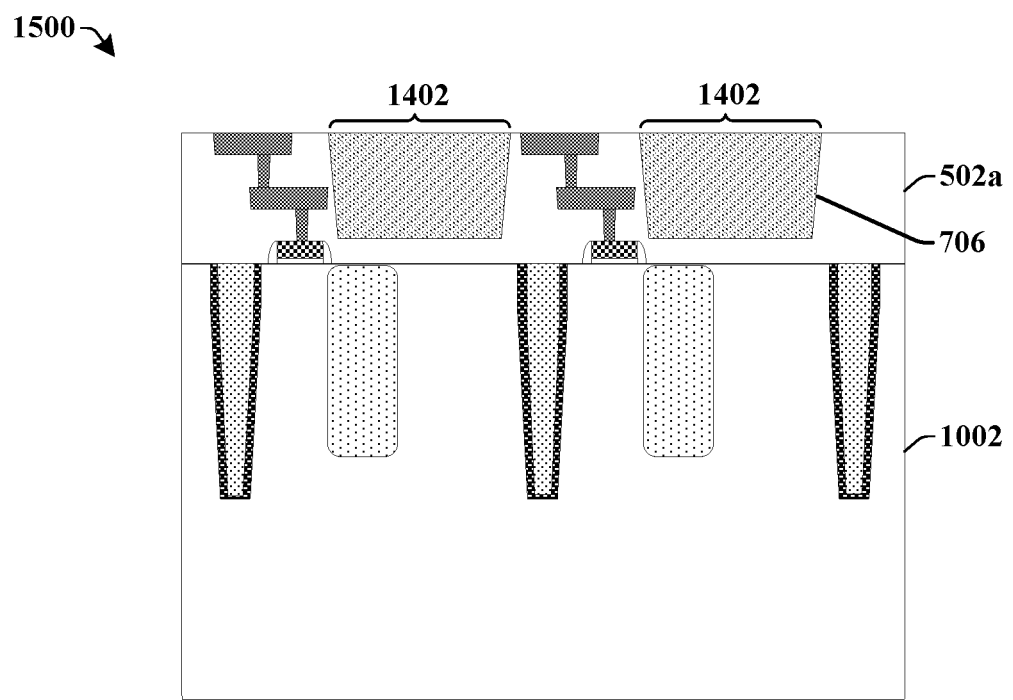

As shown in cross-sectional view 1500 of FIG. 15, waveguides 706 are formed within the waveguide openings 1402. In some embodiments, the waveguide 706 may be formed by filling the waveguide openings 1402 with a dielectric waveguide material and subsequently performing a planarization process to remove the dielectric waveguide material from over the first dielectric structure 502a. In some embodiments, the dielectric waveguide material may comprise an oxide, a nitride, or the like.

Figure 16:
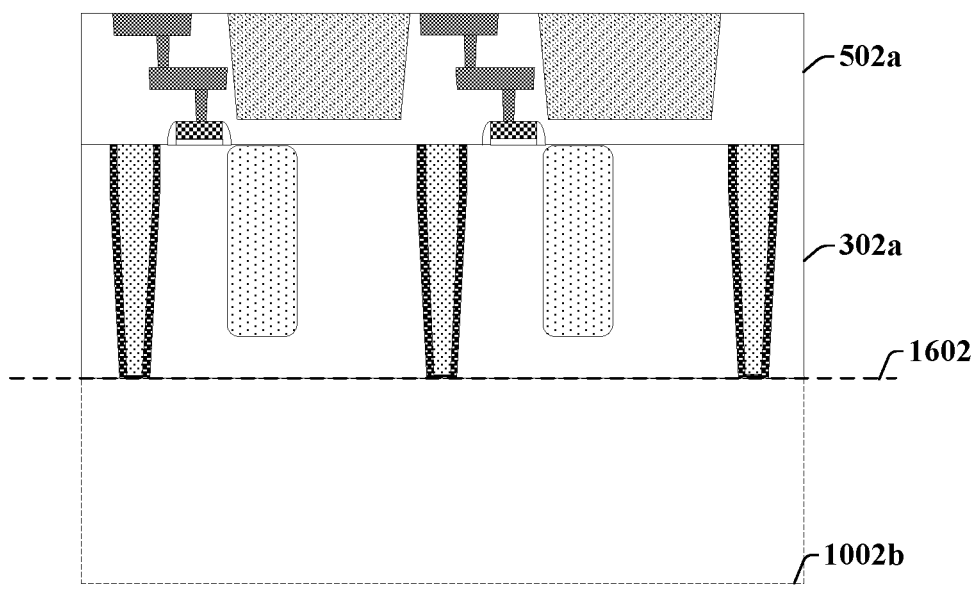

As shown in cross-sectional view 1600 of FIG. 16, the first substrate 1002 is thinned to form a first substrate 302a. Thinning the first substrate 1002 allows for radiation to pass more easily to the first image sensor element 104a within the first substrate 302a. In various embodiments, the first substrate 1002 may be thinned by etching and/or mechanical grinding a back-side 1002b of the first substrate 1002 to along line 1602.

Figure 17:
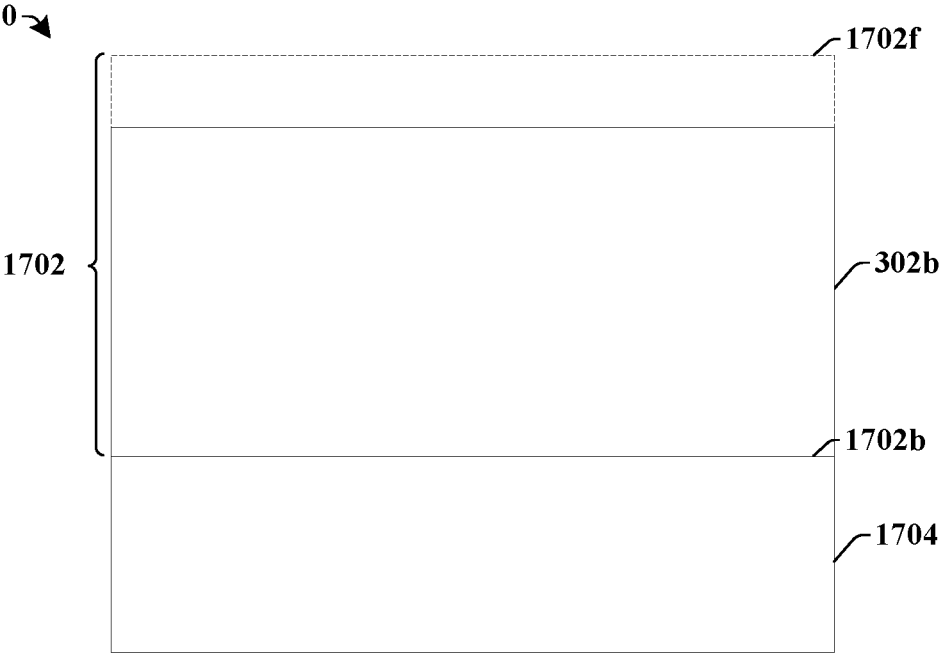

As shown in cross-sectional view 1700 of FIG. 17, a back-side 1702b of a second substrate 1702 is bonded to a support substrate 1704. The second substrate 1702 may be any type of semiconductor body (e.g., silicon, SiGe, SOI, etc.), as well as any other type of semiconductor and/or epitaxial layers, associated therewith. In some embodiments, the support substrate 1704 may comprise a silicon substrate. In some embodiments, the second substrate 1702 may be thinned after bonding to form a second substrate 302b. Thinning the second substrate 1702 allows for radiation to pass more easily to image sensing elements subsequently formed within the second substrate 302b. In various embodiments, the second substrate 1702 may be thinned by etching and/or mechanical grinding a front-side 1702f of the second substrate 1702.

Figure 18:
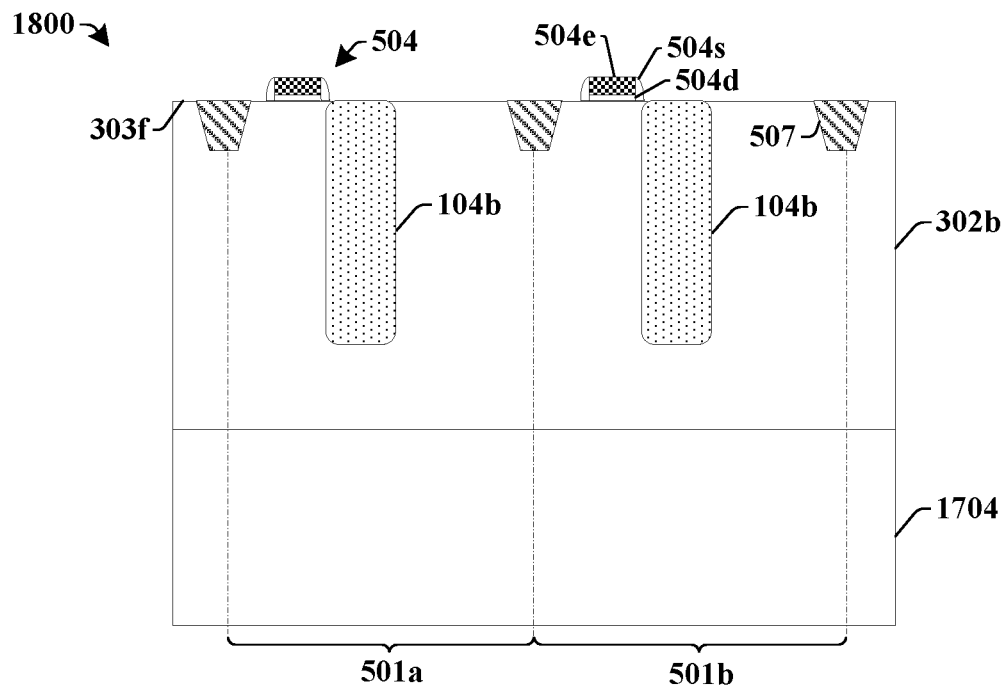

As shown in cross-sectional view 1800 of FIG. 18, a second image sensor element 104b is formed within pixel regions 501a-501b of the second substrate 302b. In some embodiments, the second image sensor element 104b may comprise a photodiode formed by implanting one or more dopant species into a front-side 303f of the second substrate 302b. For example, the photodiode may be formed by selectively performing a first implantation process (e.g., according to a masking layer) to form a first region having a first doping type (e.g., n-type), and subsequently performing a second implantation process to form a second region abutting the first region and having a second doping type (e.g., p-type) different than the first doping type. In some embodiments a floating diffusion node (not shown) may also be formed using one of the first or second implantation processes.

One or more transistor gate structures 504 are formed along the front-side 303f of the second substrate 302b within the pixel regions 501a-501b. In various embodiments, the one or more transistor gate structures 504 may correspond to a transfer transistor, a source-follower transistor, a row select transistor, and/or a reset transistor. In some embodiments, the one or more transistor gate structures 504 may be formed by depositing a gate dielectric film and a gate electrode film on the front-side 303f of the second substrate 302b. The gate dielectric film and the gate electrode film are subsequently patterned to form a gate dielectric layer 504d and a gate electrode 504e. Sidewall spacers 504s may be formed on the outer sidewalls of the gate electrode 504e. In some embodiments, the sidewall spacers 504s may be formed by depositing a spacer layer (e.g., a nitride, an oxide, etc.) onto the front-side 303f of the second substrate 302b and selectively etching the spacer layer to form the sidewall spacers 504s.

In some embodiments, one or more shallow trench isolation (STI) structures 507 may be formed within the front-side 303f of the second substrate 302b on opposing sides of the pixel regions 501a-501b. The STI structures 508 may be formed by selectively etching the front-side 303f of the second substrate 302b to form shallow trenches and subsequently forming one or more dielectric materials within the shallow trenches. In some embodiments, the STI structures 508 may be formed prior to formation of the one or more transistor gate structures 504 and/or the second image sensor element 104b.

Figure 19:
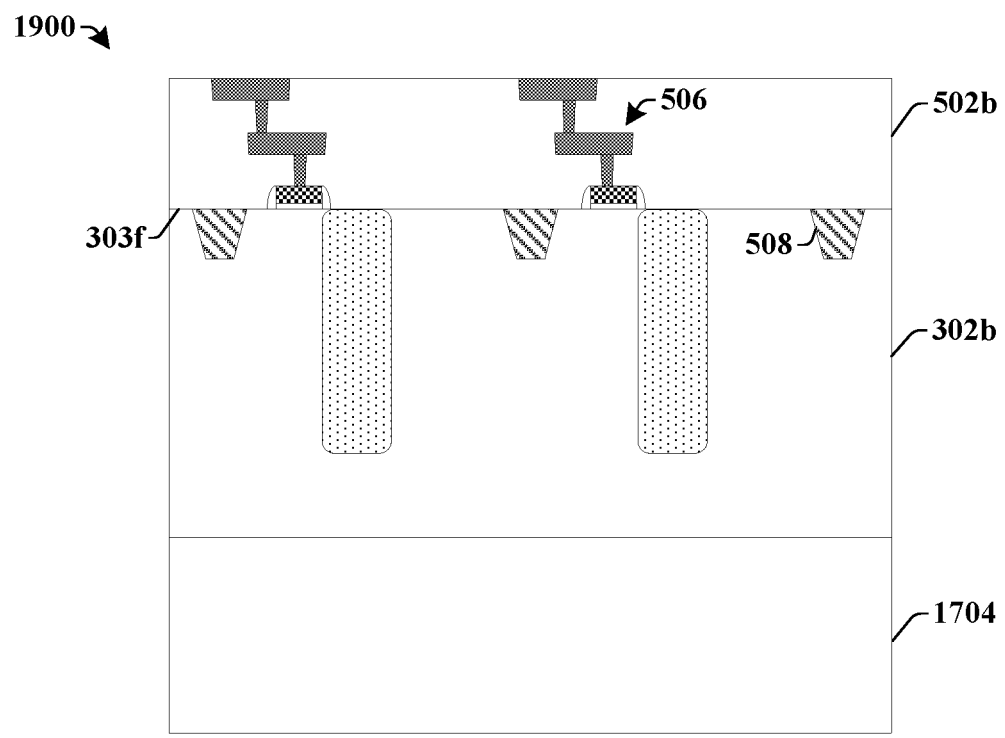

As shown in cross-sectional view 1900 of FIG. 19, a plurality of conductive interconnect layers 506 are formed within a second dielectric structure 502b formed along the front-side 303f of the second substrate 302b. The second dielectric structure 502b comprises a plurality of stacked ILD layers, while the plurality of conductive interconnect layers 506 comprise alternating layers of conductive wires and vias. In some embodiments, one or more of the plurality of conductive interconnect layers 506 may be formed using a damascene process (e.g., a single damascene process or a dual damascene process).

Figure 20:
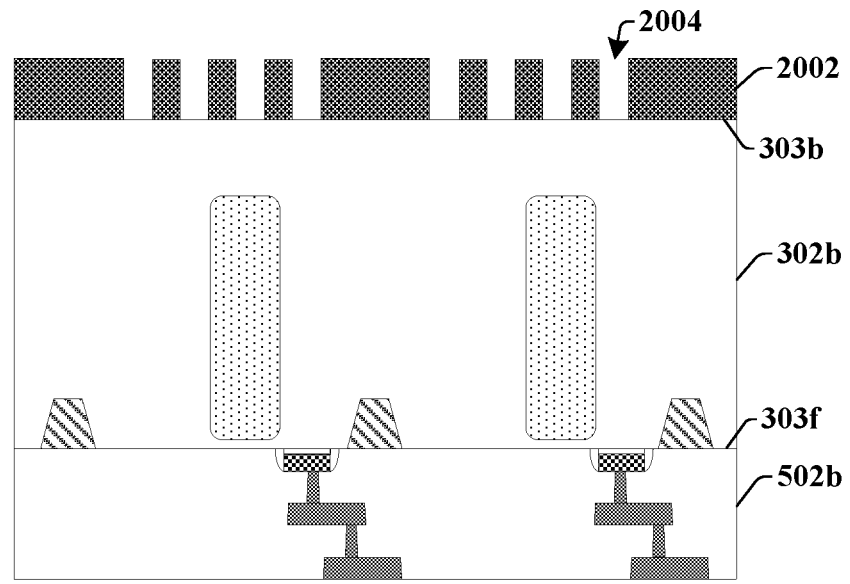

As shown in cross-sectional view 2000 of FIG. 20, a patterned masking layer 2002 is formed along a back-side 303b of the second substrate 302b. The patterned masking layer 2002 comprises sidewalls defining openings 2004. In some embodiments, the patterned masking layer 2002 may be formed by depositing a layer of photosensitive material (e.g., a positive or negative photoresist) along the back-side 303b of the second substrate 302b. The layer of photosensitive material is selectively exposed to electromagnetic radiation according to a photomask. The electromagnetic radiation modifies a solubility of exposed regions within the photosensitive material to define soluble regions. The photosensitive material is subsequently developed to define the openings 2004 within the photosensitive material by removing the soluble regions.

Figure 21:
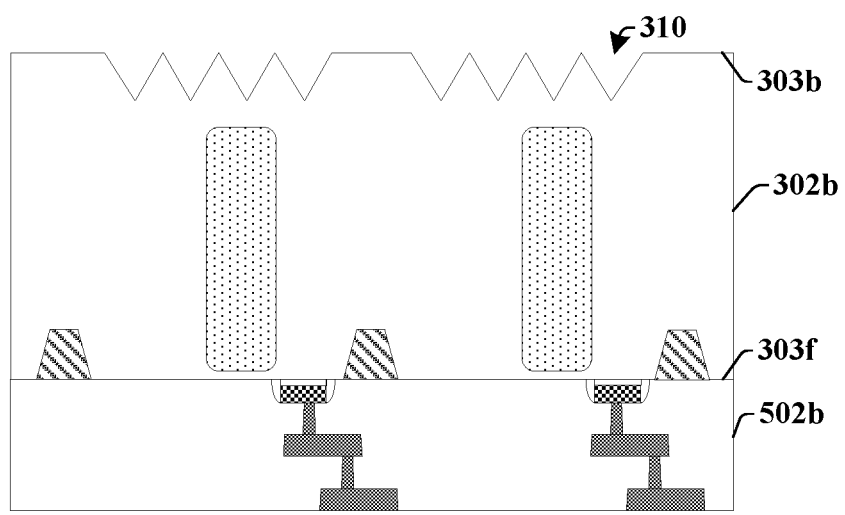

As shown in cross-sectional view 2100 of FIG. 21, a third etching process is performed on the back-side 303b of the second substrate 302b according to the patterned masking layer (2002 of FIG. 20). The third etching process is performed by exposing the back-side 303b of the second substrate 302b to one or more etchants with the patterned masking layer 2002 in place. The one or more etchants remove parts of the second substrate 302b to define a plurality of recesses 310 arranged between a plurality of protrusions extending outward from the second substrate 302b. In some embodiments, the third etching process may comprise a dry etching process. For example, the third etching process may comprise a coupled plasma etching process, such as an inductively coupled plasma (ICP) etching process or a capacitively coupled plasma (CCP) etching process. In other embodiments, the third etching process may comprise a wet etching process.

Figure 22:
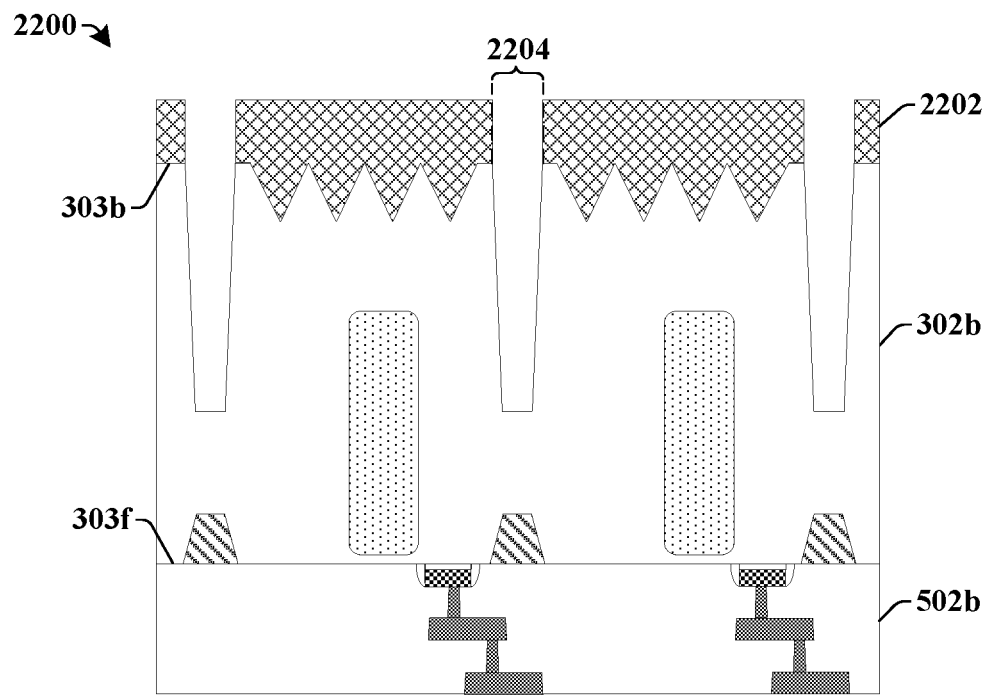

As shown in cross-sectional view 2200 of FIG. 22, a fourth etching process is performed on the back-side 303b of the second substrate 302b according to a patterned masking layer 2202. The fourth etching process is performed by exposing unmasked regions of the second substrate 302b to one or more etchants, which remove parts of the second substrate 302b in the unmasked regions to define trenches 2204 within the second substrate 302b. In some embodiments, the trenches 2204 comprise tapered sidewalls that cause a width of the trenches 2204 to respectively decrease as a distance from the back-side 303b of the second substrate 302b increases.

Figure 23:
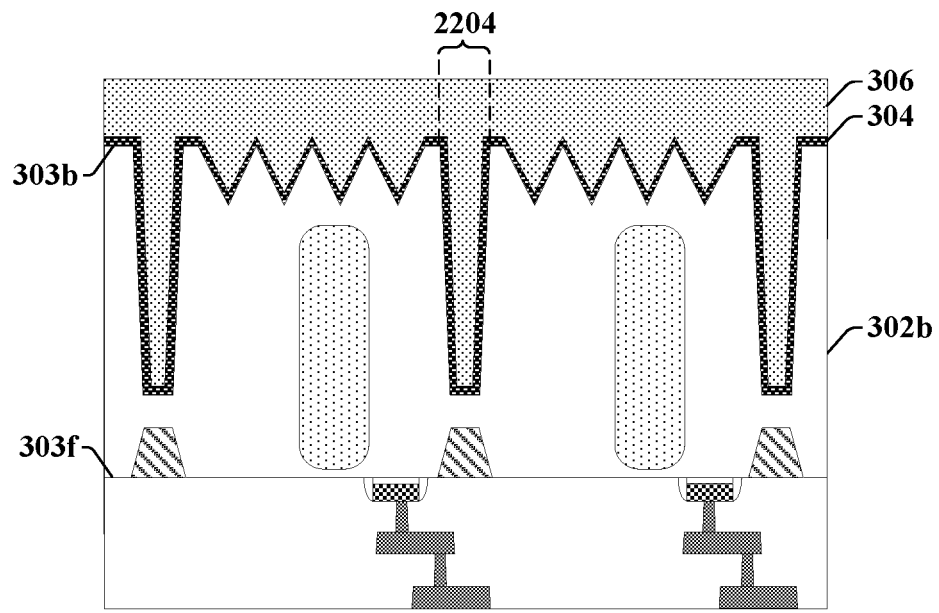

As shown in cross-sectional view 2300 of FIG. 23, one or more dielectric layer 304-306 are formed within the trenches 2204. A planarization process is subsequently performed to define back-side deep trench isolation (BDTI) structures 514. The one or more dielectric materials may comprise a first dielectric layer 304 and a second dielectric layer 306. In some embodiments, the first dielectric layer 304 may comprise a high-k dielectric layer including hafnium oxide ($HfO_2$), titanium oxide ($TiO_2$), hafnium zirconium oxide (HfZrO), tantalum oxide ($Ta_2O_3$), hafnium silicon oxide ($HfSiO_4$), zirconium oxide ($ZrO_2$), zirconium silicon oxide ($ZrSiO_2$), etc. In some embodiments, the first dielectric layer 304 may be deposited by a deposition technique (e.g., PVD, CVD, PE-CVD, ALD, etc.). In some embodiments, the second dielectric layer 306 may comprise an oxide (e.g., silicon oxide), TEOS, etc.

Figure 24B:
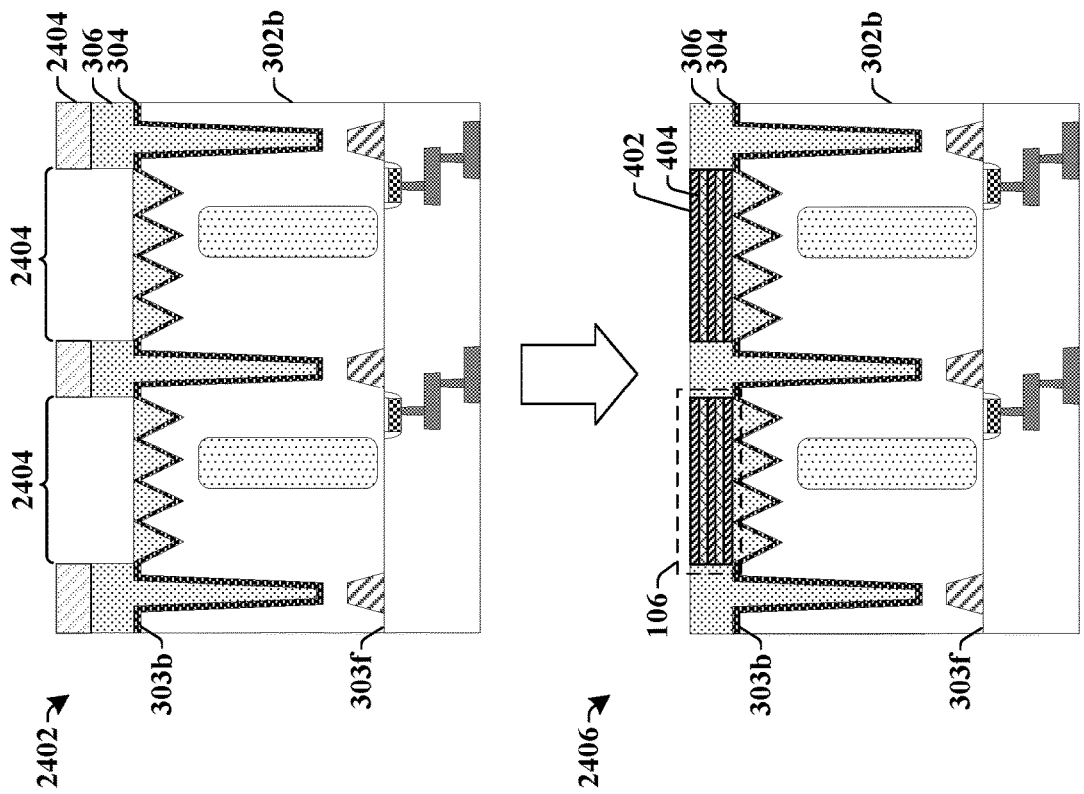
Figure 24A:
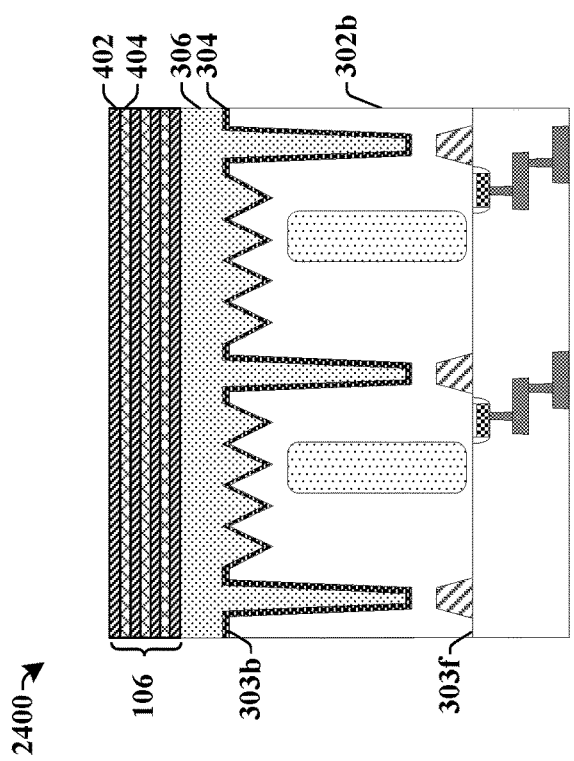

As shown in cross-sectional view 2400 of FIG. 24A, a band-pass filter 106 is formed over the second dielectric layer 306. The band-pass filter 106 is formed by depositing a plurality of layers of materials, 402 and 404, over the second dielectric layer 306. The plurality of layers of materials, 402 and 404, comprise alternating layers of a first material 402 and layers of a second material 404. In some embodiments, the layers of the first material 402 may comprise a first refractive index and the layers of the second material 404 comprises a second refractive index different than the first refractive index. In some embodiments, the layers of the first material 402 may comprise silicon and the layers of the second material 404 may comprise silicon oxide.

In some alternative embodiments, the band-pass filter 106 may be formed as shown in FIG. 24B. As shown in cross-sectional view 2402 of FIG. 24B, the second dielectric structure 502b is selectively etched to form band-pass recesses 2404 defined by sidewalls of the second dielectric structure 502b. As shown in cross-sectional view 2406 of FIG. 24B, the band-pass filter 106 may be formed within the band-pass recesses 2404.

Figure 25:
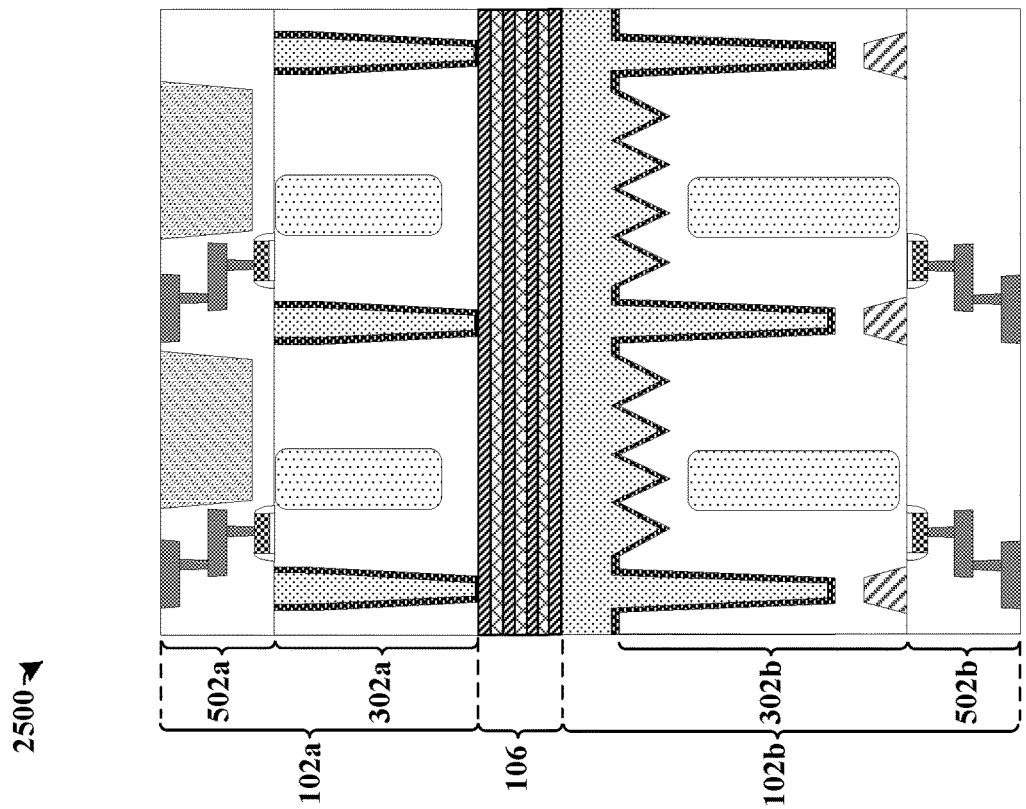

As shown in cross-sectional view 2500 of FIG. 25, the band-pass filter 106 is bonded to the first substrate 302a of the first IC die 102a. In some embodiments, the band-pass filter 106 may be bonded to the first substrate 302a by way of a fusion bonding process. In some such embodiments (not shown), an additional dielectric layer may be formed along a back-side of the first substrate 302a prior to the fusion bonding process.

Figure 26:
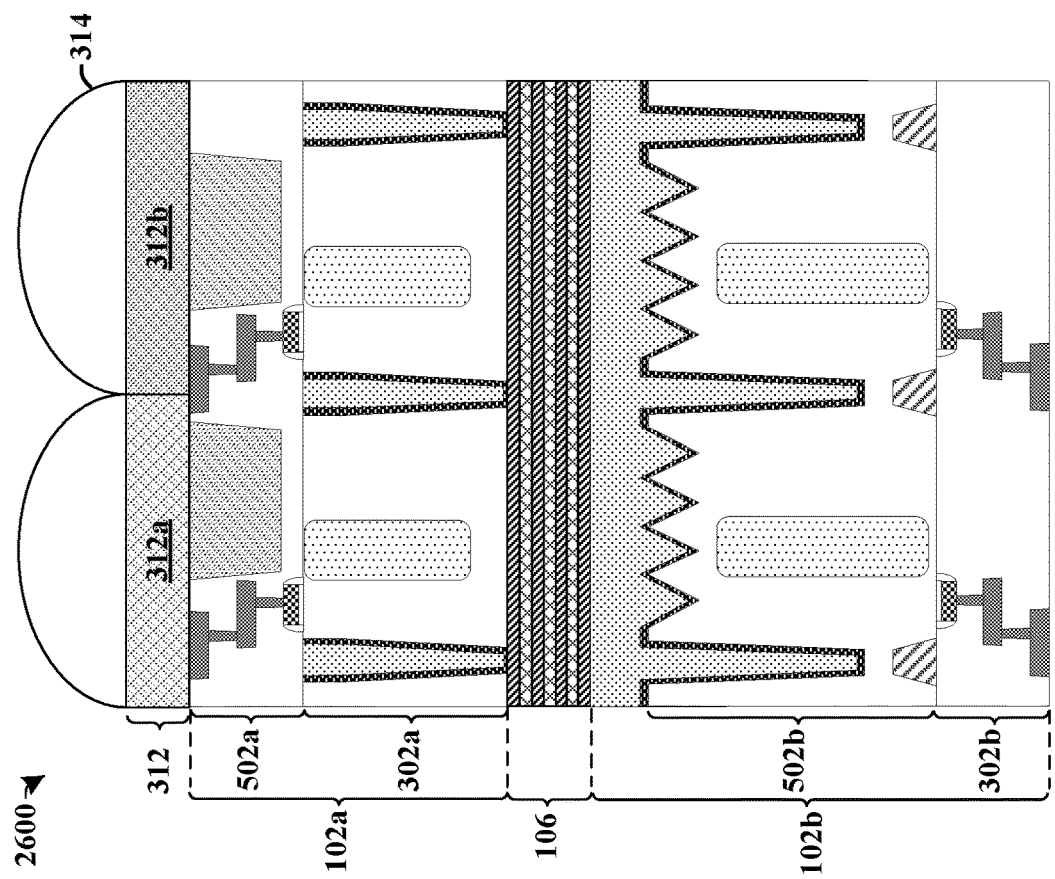

As shown in cross-sectional view 2600 of FIG. 26, a color filter 312 is formed over the first IC die 102a and a micro-lens 314 is subsequently formed over the color filter. The color filter 312 is formed of a material that allows for the transmission of radiation (e.g., light) having a specific range of wavelength, while blocking light of wavelengths outside of the specified range. In some embodiments, micro-lens 314 may be formed by depositing a micro-lens material above the color filter 312 (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The micro-lens 314 can then be formed by selectively etching the micro-lens material according to the micro-lens template.

Figure 27:
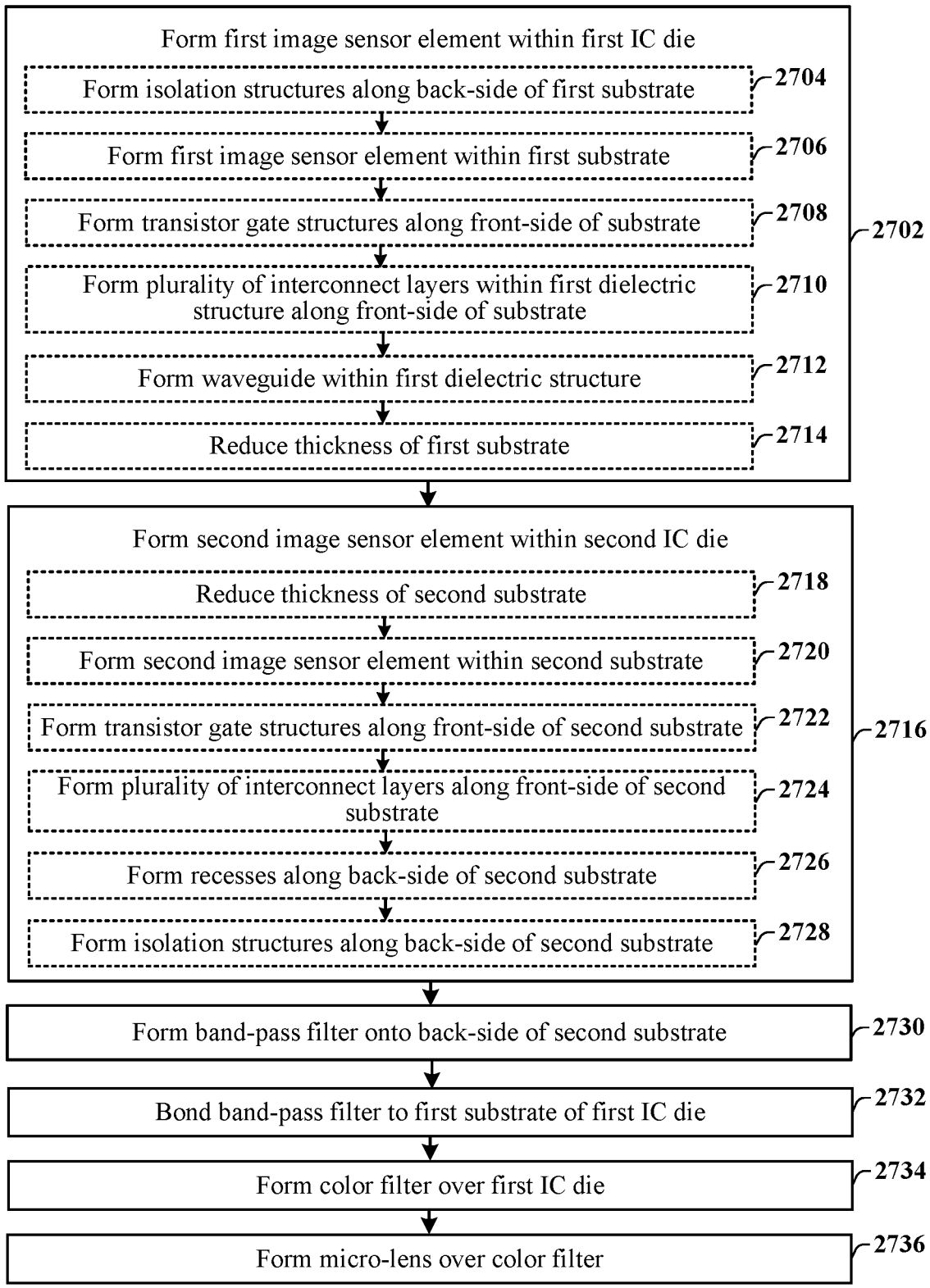
FIG. 27 illustrates a flow diagram of some embodiments of a method of forming a stacked image sensor device comprising an inter-substrate band-pass filter.

FIG. 27 illustrates a flow diagram of some embodiments of a method 2700 of forming a stacked image sensor device comprising an inter-substrate band-pass filter.

While the disclosed methods (e.g., methods 2700 and 3600) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2702, a first image sensor element is formed within a first IC die. In some embodiments, the first image sensor element may be formed according to acts 2704-2714.

At 2704, isolation structures are formed along a front-side of a first substrate. FIGS. 10-11 illustrate cross-sectional views 1000-1100 of some embodiments corresponding to act 2704.

At 2706, a first image sensor element is formed within the first substrate. FIG. 12 illustrates a cross-sectional view 1200 of some embodiments corresponding to act 2706.

At 2708, transistor gate structures are formed along the front-side of the first substrate. FIG. 12 illustrates a cross-sectional view 1200 of some embodiments corresponding to act 2706.

At 2710, a plurality of interconnect layers are formed within a first dielectric structure along the front-side of the first substrate. FIG. 13 illustrates a cross-sectional view 1300 of some embodiments corresponding to act 2710.

At 2712, a waveguide structure is formed within the first dielectric structure. FIGS. 14-15 illustrate cross-sectional views 1400-1500 of some embodiments corresponding to act 2712.

At 2714, a thickness of the first substrate is reduced. FIG. 16 illustrates a cross-sectional view 1600 of some embodiments corresponding to act 2714.

At 2716, a second image sensor element is formed within a second IC die. In some embodiments, the second image sensor element may be formed according to acts 2718-2728.

At 2718, a thickness of a second substrate is reduced. FIG. 17 illustrates a cross-sectional view 1700 of some embodiments corresponding to act 2718.

At 2720, a second image sensor element is formed within the second substrate. FIG. 18 illustrates a cross-sectional view 1800 of some embodiments corresponding to act 2720.

At 2722, transistor gate structures are formed along the front-side of the second substrate. FIG. 18 illustrates a cross-sectional view 1800 of some embodiments corresponding to act 2722.

At 2724, a plurality of interconnect layers are formed within a second dielectric structure along the front-side of the second substrate. FIG. 19 illustrates a cross-sectional view 1900 of some embodiments corresponding to act 2724.

At 2726, a back-side of the second substrate is selectively etched to define one or more recesses. FIGS. 20-21 illustrate cross-sectional views 2000-2100 of some embodiments corresponding to act 2726.

At 2728, isolation structures are formed along the back-side of the second substrate. FIGS. 22-23 illustrate cross-sectional views 2200-2300 of some embodiments corresponding to act 2728.

At 2730, a band-pass filter is formed onto the back-side of the second substrate. FIGS. 24A-24B illustrate cross-sectional views, 2400 and 2402, of some embodiments corresponding to act 2730.

At 2732, the band-pass filter is bonded to the first substrate of the first IC die. FIG. 25 illustrates a cross-sectional view 2500 of some embodiments corresponding to act 2732.

At 2734, a color filter is formed over the first IC die. FIG. 26 illustrates a cross-sectional view 2600 of some embodiments corresponding to act 2734.

At 2736, a micro-lens is formed over the color filter. FIG. 26 illustrates a cross-sectional view 2600 of some embodiments corresponding to act 2736.

FIGS. 28-35 illustrate cross-sectional views 2800-3500 of some additional embodiments of forming a stacked image sensor device comprising an inter-substrate band-pass filter. Although the cross-sectional views 2800-3500 shown in FIGS. 28-35 are described with reference to a method of forming a stacked image sensor device comprising an inter-substrate band-pass filter, it will be appreciated that the structures shown in FIGS. 28-35 are not limited to the method of formation but rather may stand alone separate of the method.

Figure 28:
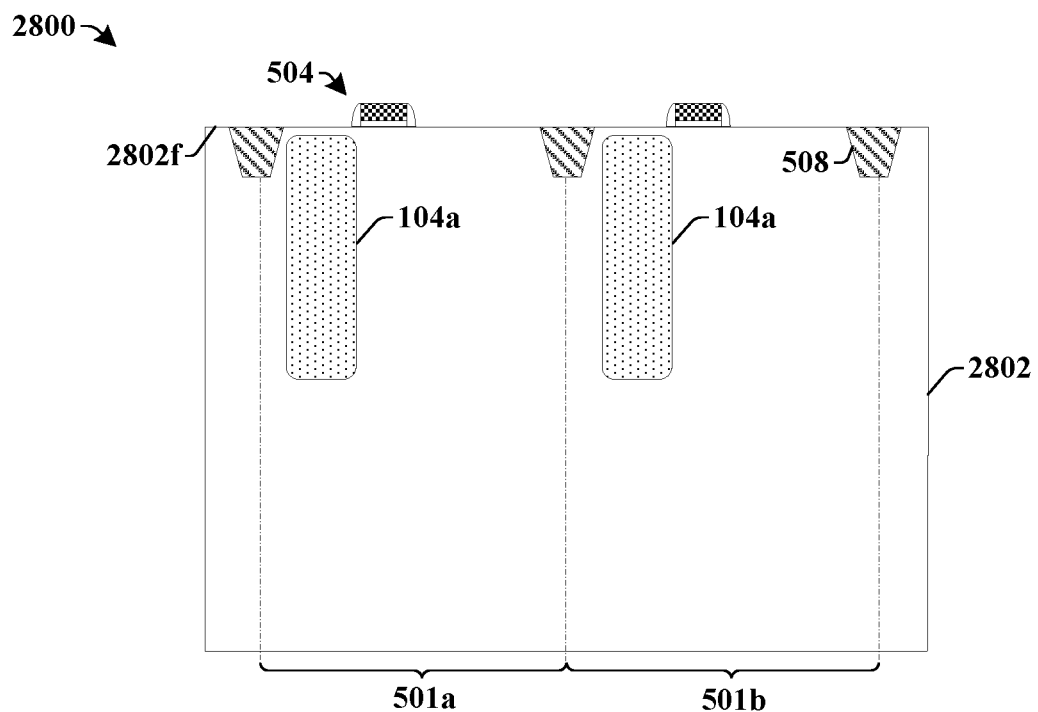
FIGS. 28-35 illustrate cross-sectional views of some additional embodiments of a method of forming a stacked image sensor device comprising an inter-substrate band-pass filter.

As shown in cross-sectional view 2800 of FIG. 28, a first image sensor element 104a is formed within pixel regions 501a-501b of a first substrate 2802. The first image sensor element 104a is configured to generate electrical signals in response to electromagnetic radiation having wavelengths within a first range. In some embodiments, the first image sensor element 104a may comprise a photodiode formed by implanting one or more dopant species into a front-side 2802f of the first substrate 2802.

One or more transistor gate structures 504 are formed along the front-side 2802f of the first substrate 2802 within the pixel regions 501a-501b. In various embodiments, the one or more transistor gate structures 504 may correspond to a transfer transistor, a source-follower transistor, a row select transistor, and/or a reset transistor. In some embodiments, one or more shallow trench isolation (STI) structures 508 may be formed within the front-side 2802f of the first substrate 2802 on opposing sides of the pixel regions 501a-501b.

Figure 29:
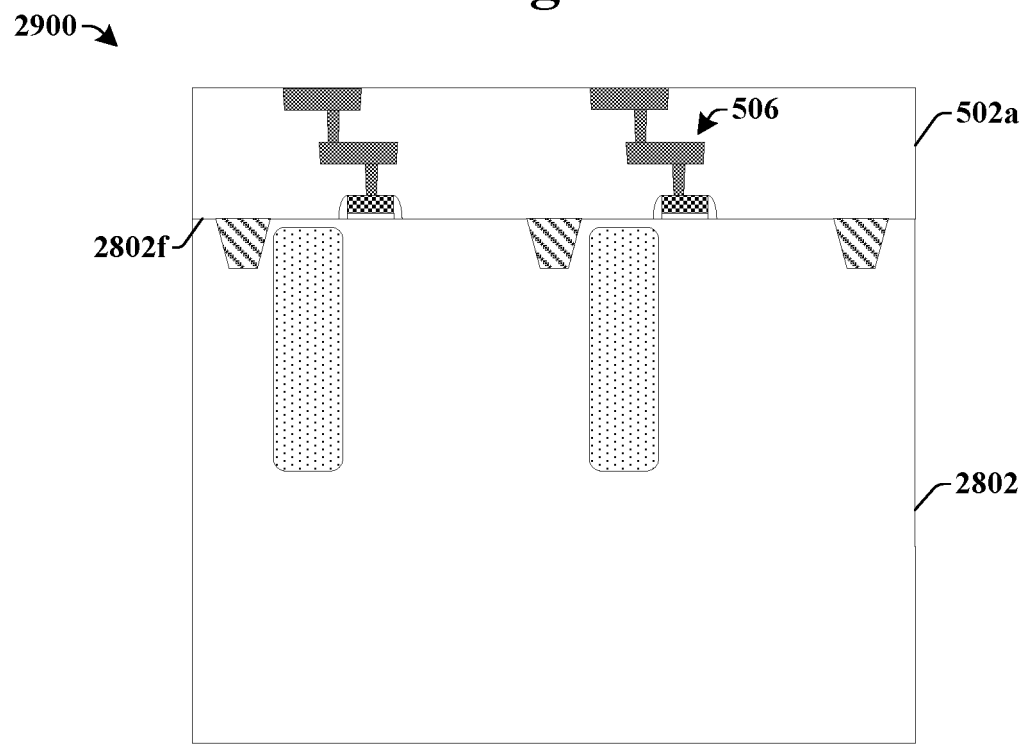

As shown in cross-sectional view 2900 of FIG. 29, a plurality of conductive interconnect layers 506 are formed within a first dielectric structure 502a formed along the front-side 2802f of the first substrate 2802. The first dielectric structure 502a comprises a plurality of stacked inter-level dielectric (ILD) layers, while the plurality of conductive interconnect layers 506 comprise alternating layers of conductive wires and vias. In some embodiments, one or more of the plurality of conductive interconnect layers 506 may be formed using a damascene process (e.g., a single damascene process or a dual damascene process).

Figure 30B:
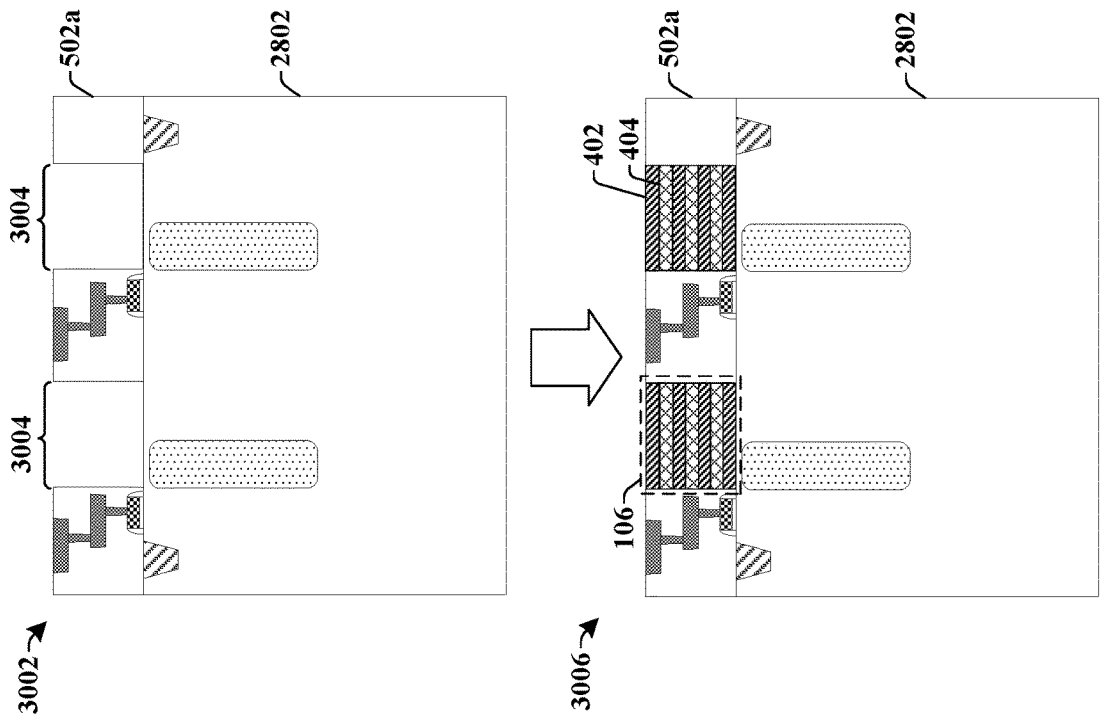
Figure 30A:
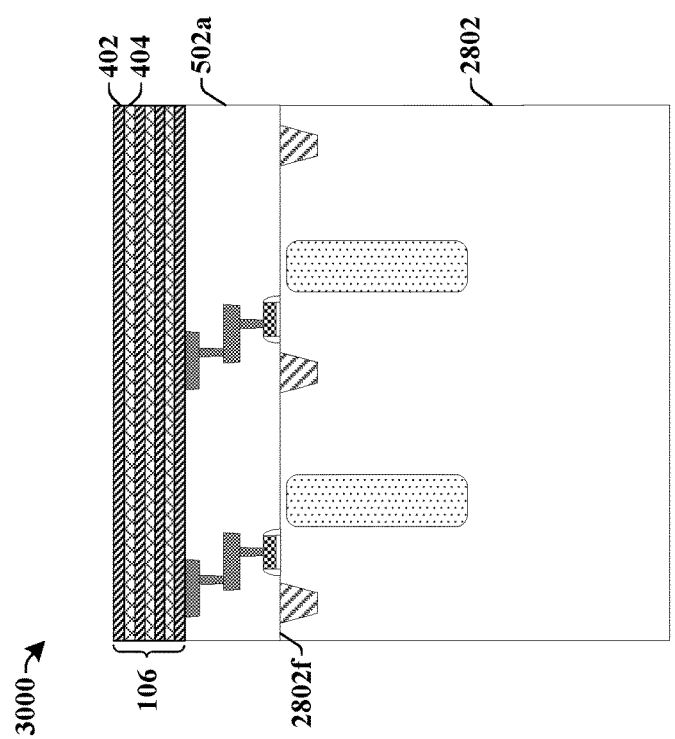

As shown in cross-sectional view 3000 of FIG. 30A, a band-pass filter 106 is formed over the first dielectric structure 502a. The band-pass filter 106 is formed by depositing a plurality of layers of materials, 402 and 404, over the first dielectric structure 502a. The plurality of layers of materials, 402 and 404, comprise alternating layers of a first material 402 and layers of a second material 404. In some embodiments, the layers of the first material 402 may comprise a first refractive index and the layers of the second material 404 may comprise a second refractive index different than the first refractive index.

In some alternative embodiments, the band-pass filter 106 may be formed as shown in FIG. 30B. As shown in cross-sectional view 3002 of FIG. 30B, the first dielectric structure 502a is selectively etched to form band-pass recesses 3004 defined by sidewalls of the first dielectric structure 502a. As shown in cross-sectional view 3006 of FIG. 30B, the band-pass filter 106 may be formed within the band-pass recesses 3004.

Figures 31, 32:
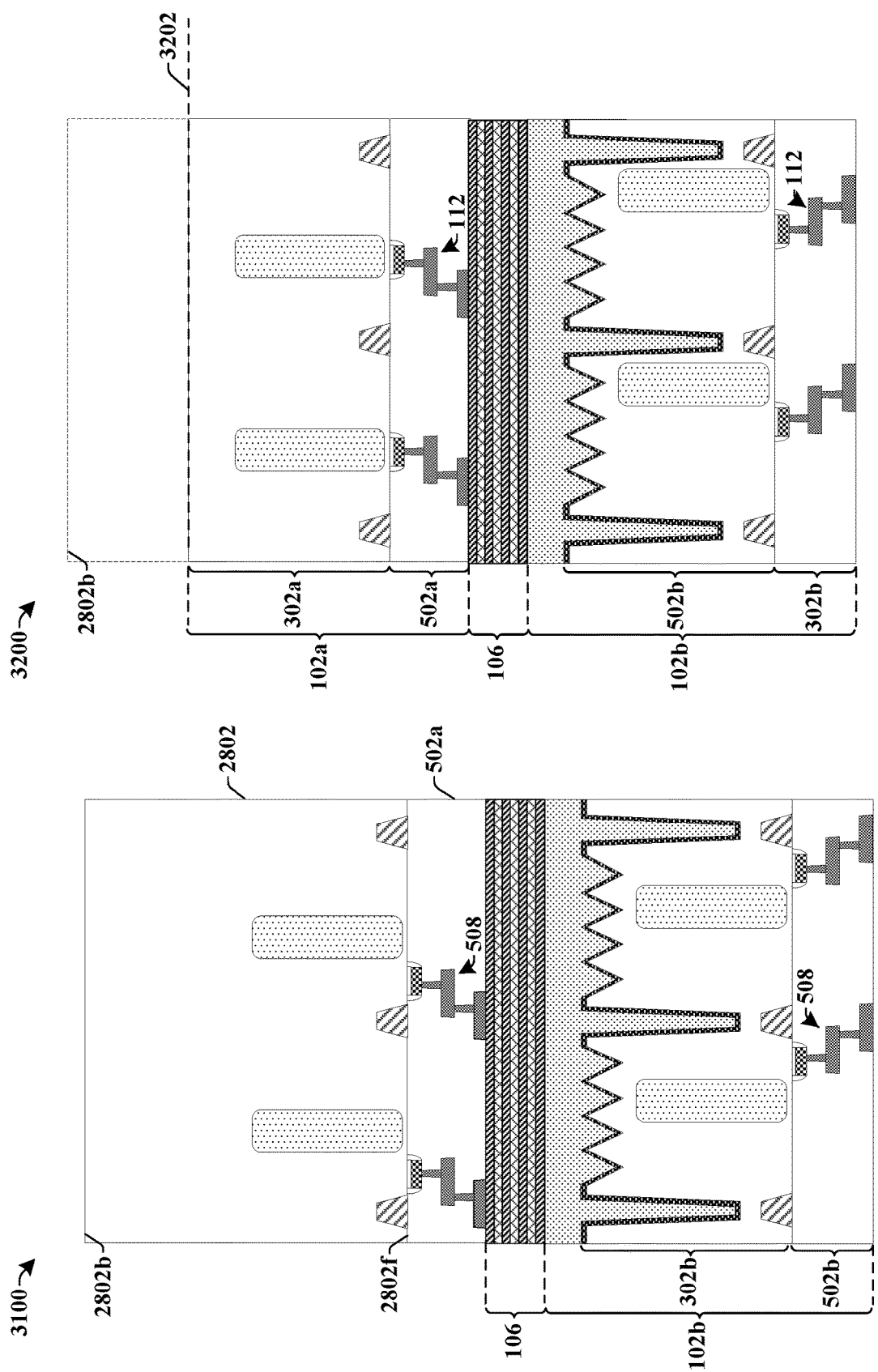

As shown in cross-sectional view 3100 of FIG. 31, the band-pass filter 106 is bonded to a second IC die 102b. In some embodiments, the second IC die 102b may be formed as shown in cross-sectional views 1700-2300 of FIGS. 17-23. In some embodiments, the band-pass filter 106 may be bonded to the second IC die 102b by way of a fusion bonding process.

As shown in cross-sectional view 3200 of FIG. 32, the first substrate 2802 is thinned to form a first substrate 302a. Thinning the first substrate 2802 allows for radiation to pass more easily to the first image sensor element 104a within the first substrate 302a. In various embodiments, the first substrate 2802 may be thinned by etching and/or mechanical grinding a back-side 2802b of the first substrate 2802 along line 3202.

Figure 33:
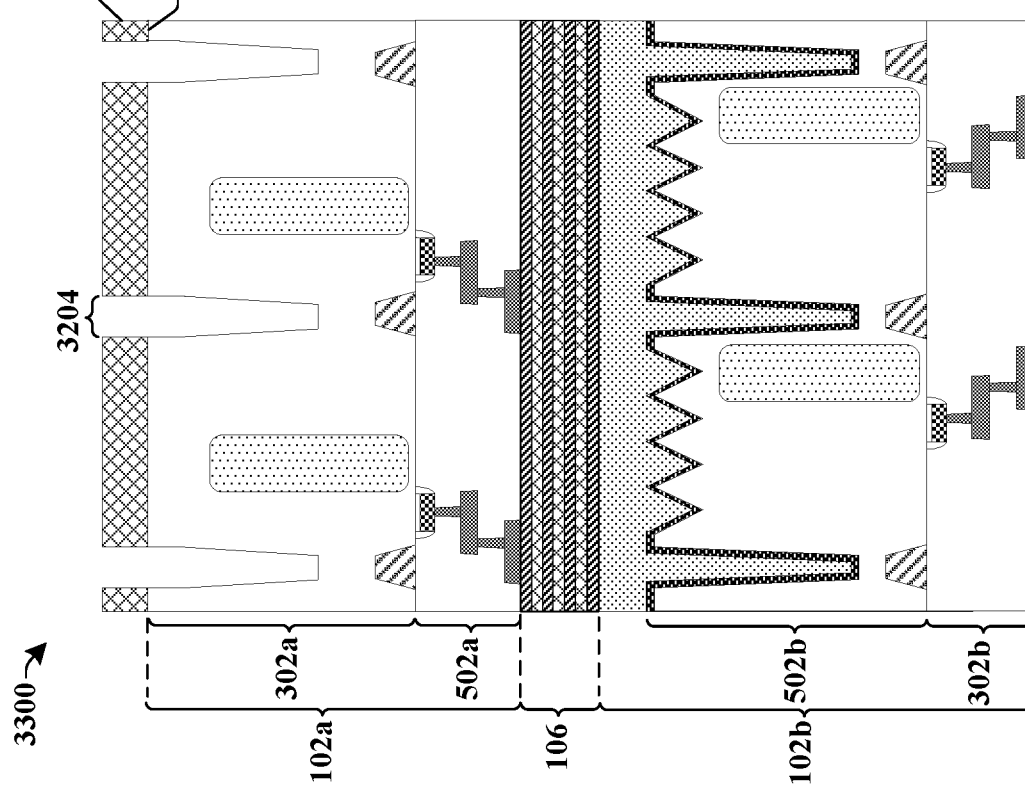

As shown in cross-sectional view 3300 of FIG. 33, an etching process is performed on the back-side 301b of the first substrate 302a according to a second patterned masking layer 3302. The etching process is performed by exposing unmasked regions of the first substrate 302a to one or more etchants, which remove parts of the first substrate 302a in the unmasked regions to define trenches 3204 within the first substrate 302a. In some embodiments, the trenches 3204 comprise tapered sidewalls that cause a width of the trenches 3204 to respectively decrease as a distance from the back-side 301b of the first substrate 302a increases.

Figure 34:
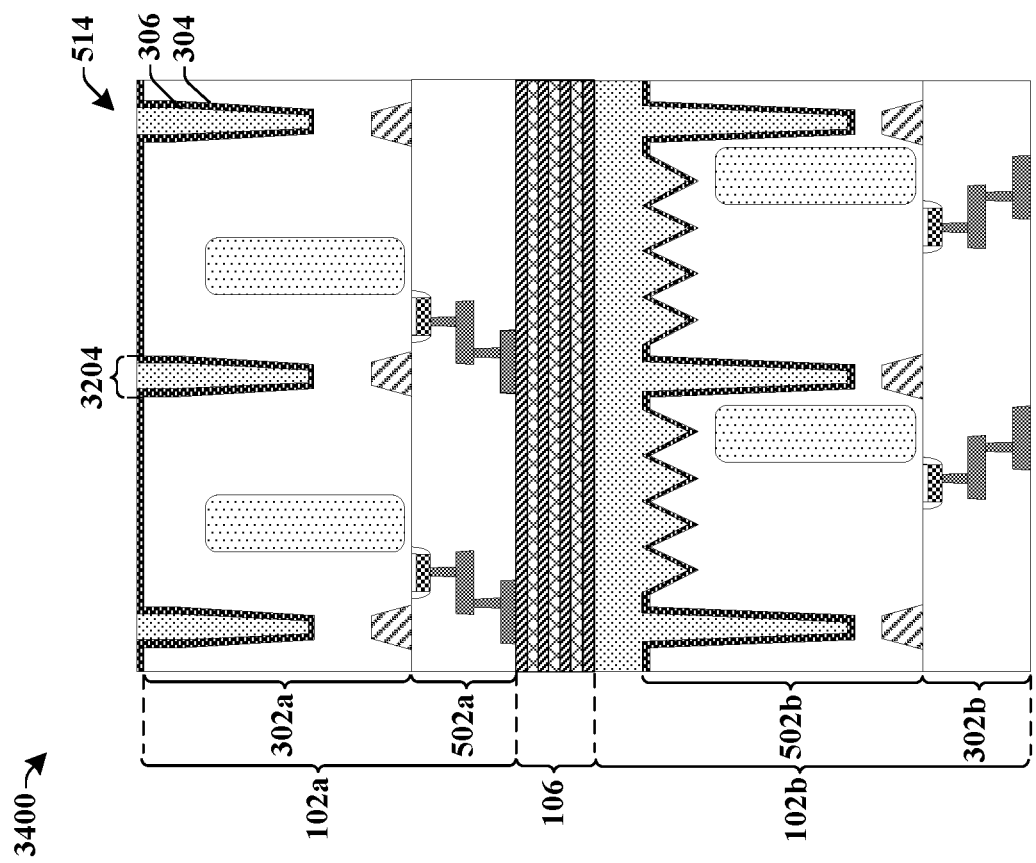

As shown in cross-sectional view 3400 of FIG. 34, one or more dielectric layer 304-306 are formed within the trenches 3204. A planarization process is subsequently performed to define back-side deep trench isolation structures 514. The one or more dielectric materials may comprise a first dielectric layer 304 and a second dielectric layer 306. In some embodiments, the first dielectric layer 304 may comprise a high-k dielectric layer. In some embodiments, the second dielectric layer 306 may comprise an oxide (e.g., silicon oxide), TEOS, etc.

Figure 35:
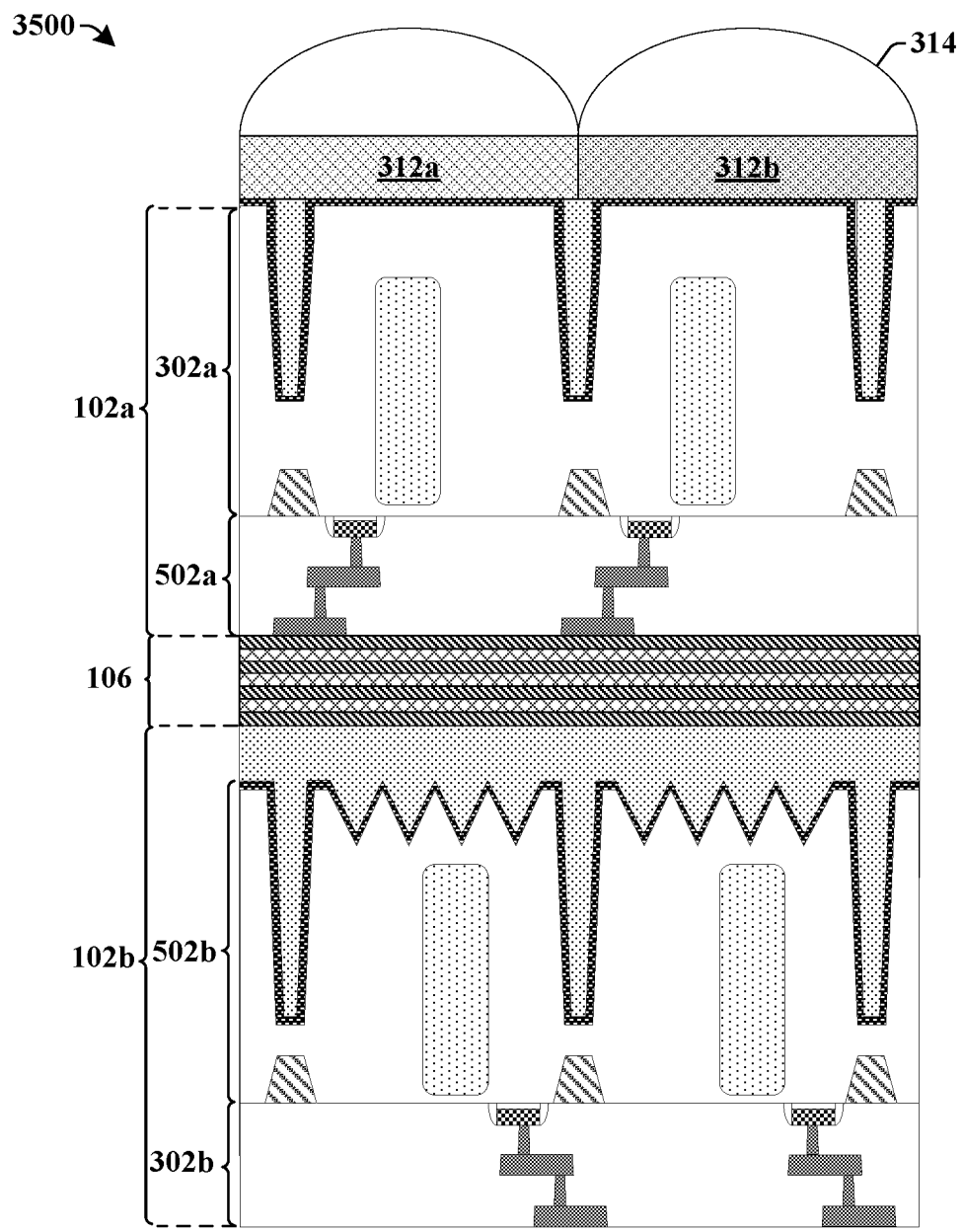

As shown in cross-sectional view 3500 of FIG. 35, a color filter 312 is formed over the first IC die 102a and a micro-lens 314 is subsequently formed over the color filter.

Figure 36:
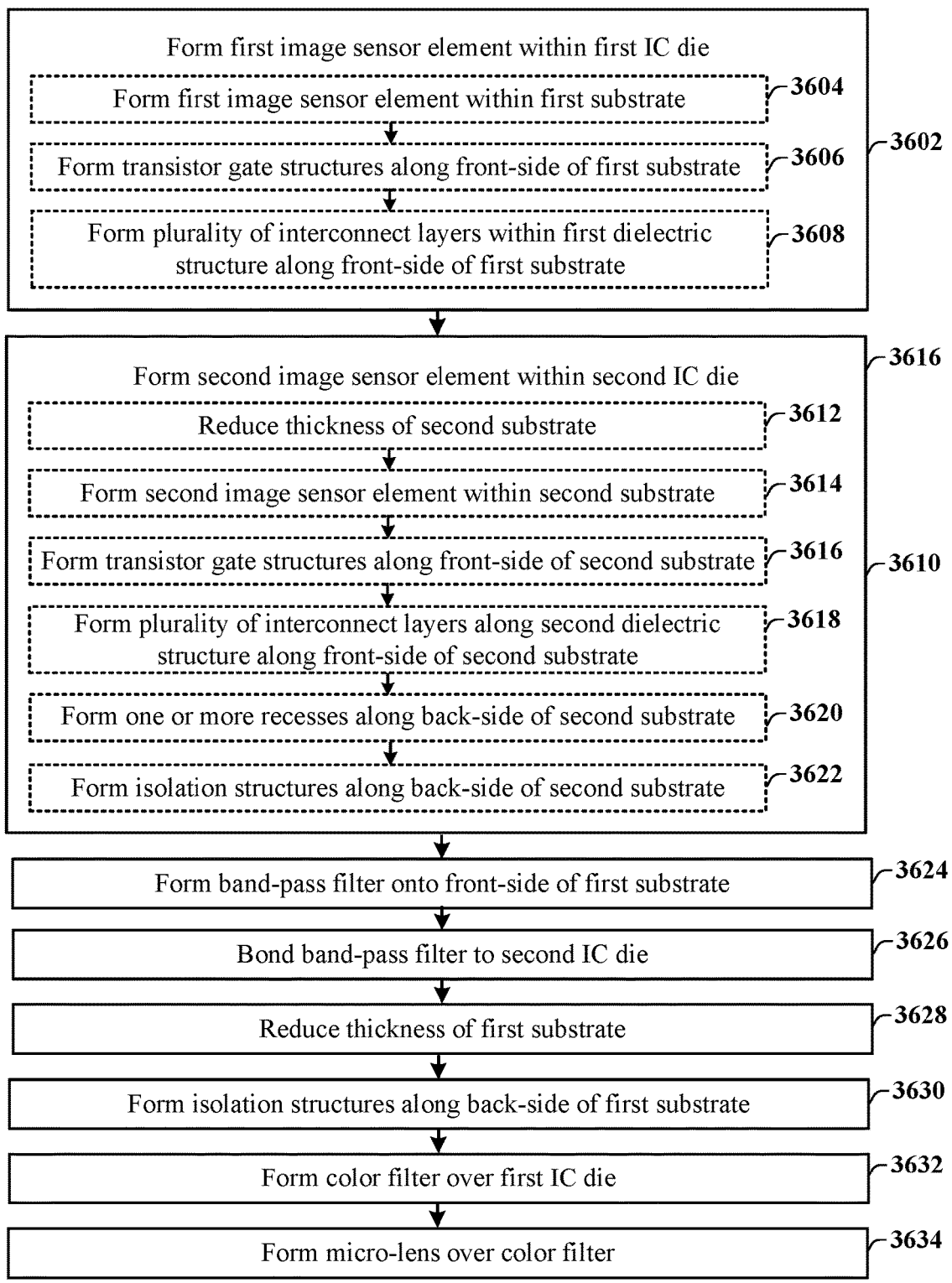
FIG. 36 illustrates a flow diagram of some additional embodiments of a method of forming a stacked image sensor device comprising an inter-substrate band-pass filter.

FIG. 36 illustrates a flow diagram of some embodiments of a method 3600 of forming a stacked image sensor device comprising an inter-substrate band-pass filter.

At 3602, a first image sensor element is formed within a first IC die. In some embodiments, the first image sensor element may be formed according to acts 3604-3608.

At 3604, a first image sensor element is formed within the first substrate. FIG. 28 illustrates cross-sectional views 2800 of some embodiments corresponding to act 3604.

At 3606, transistor gate structures are formed along the front-side of the first substrate. FIG. 28 illustrates a cross-sectional view 2800 of some embodiments corresponding to act 3606.

At 3608, a plurality of interconnect layers are formed within a first dielectric structure along the front-side of the first substrate. FIG. 29 illustrates a cross-sectional view 2900 of some embodiments corresponding to act 3608.

At 3610, a second image sensor element is formed within a second IC die. In some embodiments, the second image sensor element may be formed according to acts 3612-3622.

At 3612, a thickness of the second substrate is reduced. FIG. 17 illustrates a cross-sectional view 1700 of some embodiments corresponding to act 3612.

At 3614, a second image sensor element is formed within the second substrate. FIG. 18 illustrates cross-sectional views 1800 of some embodiments corresponding to act 3614.

At 3616, transistor gate structures are formed along the front-side of the second substrate. FIG. 18 illustrates a cross-sectional view 1800 of some embodiments corresponding to act 3616.

At 3618, a plurality of interconnect layers are formed within a second dielectric structure along the front-side of the second substrate. FIG. 19 illustrates a cross-sectional view 1900 of some embodiments corresponding to act 3618.

At 3620, a back-side of the second substrate is selectively etched to define one or more recesses. FIGS. 20-21 illustrate cross-sectional views 2000-2100 of some embodiments corresponding to act 3620.

At 3622, isolation structures are formed along the back-side of the second substrate. FIGS. 22-23 illustrate cross-sectional views 2200-2300 of some embodiments corresponding to act 3622.

At 3624, a band-pass filter is formed onto a front-side of the first substrate. FIGS. 30A-30B illustrate cross-sectional views, 3300 and 3002, of some embodiments corresponding to act 3624.

At 3626, the band-pass filter is bonded to second IC die. FIG. 31 illustrates a cross-sectional view 3100 of some embodiments corresponding to act 3626.

At 3628, a thickness of the first substrate is reduced. FIG. 32 illustrates a cross-sectional view 3200 of some embodiments corresponding to act 3626.

At 3630, isolation structures are formed along a back-side of a first substrate. FIGS. 33-34 illustrate cross-sectional views 3300-3400 of some embodiments corresponding to act 3630.

At 3632, a color filter is formed over the first IC die. FIG. 35 illustrates a cross-sectional view 3500 of some embodiments corresponding to act 3632.

At 3634, a micro-lens is formed over the color filter. FIG. 35 illustrates a cross-sectional view 3500 of some embodiments corresponding to act 3634.

Accordingly, in some embodiments, the present disclosure relates to a stacked image sensor device comprising an inter-substrate band-pass filter configured to reduce cross-talk between adjacent image sensor elements In some embodiments, the present disclosure relates to a three-dimensional integrated chip. The three-dimensional integrated chip includes a first integrated chip (IC) die having a first image sensor element configured to generate electrical signals from electromagnetic radiation within a first range of wavelengths; a second IC die having a second image sensor element configured to generate electrical signals from electromagnetic radiation within a second range of wavelengths that is different than the first range of wavelengths; and a first band-pass filter arranged between the first IC die and the second IC die and configured to reflect electromagnetic radiation that is within the first range of wavelengths. In some embodiments, the integrated chip further includes a second band-pass filter separated from the first IC die by the second IC die, the second band-pass filter configured to reflect electromagnetic radiation that is within the second range of wavelengths. In some embodiments, the first band-pass filter includes a first layer of material having a first refractive index, and a second layer of material having a second refractive index that is less than the first refractive index. In some embodiments, the first band-pass filter includes a first layer of silicon, a first layer of silicon dioxide, and a second layer of silicon, the first layer of silicon dioxide continuously extends from a first surface contacting the first layer of silicon to a second surface contacting the second layer of silicon. In some embodiments, the first IC die includes a first substrate and a first dielectric structure having a plurality of stacked inter-level dielectric (ILD) layers surrounding a plurality of conductive interconnect layers. In some embodiments, the first band-pass filter is arranged between the first dielectric structure and the second IC die. In some embodiments, the integrated chip further includes a dielectric waveguide arranged laterally between sidewalls of the first dielectric structure and vertically extending through the plurality of stacked ILD layers at a position overlying the first band-pass filter. In some embodiments, the first band-pass filter is arranged between sidewalls of the first dielectric structure. In some embodiments, the first band-pass filter is configured to pass electromagnetic radiation within a passband including the second range of wavelengths. In some embodiments, the integrated chip further includes a waveguide arranged over the first IC die, the waveguide having a bottom surface facing the first IC die and a top surface facing away from the first IC die, the bottom surface having a smaller width than the top surface. In some embodiments, the first IC die includes a first substrate having a substantially planar first upper surface facing away from the second IC die, and the second IC die includes a second substrate having a second upper surface facing the first IC die, the second upper surface having angled sidewalls defining one or more recesses within the second upper surface.

In other embodiments, the present disclosure relates to a stacked image sensor device. The stacked image sensor device includes a first image sensor element disposed within a first substrate and configured to generate electrical signals from electromagnetic radiation within a first range of wavelengths, the first substrate having a first surface configured to receive incident radiation and a second surface opposing the first surface; a second image sensor element disposed within a second substrate and configured to generate electrical signals from electromagnetic radiation within a second range of wavelengths that is different than the first range of wavelengths; and a first band-pass filter arranged between the second surface of the first substrate and the second substrate and including alternating layers of a first material having a first refractive index and a second material having a second refractive index that is different than the first refractive index, the first band-pass filter configured to pass electromagnetic radiation within the second range of wavelengths and to reflect electromagnetic radiation within the first range of wavelengths. In some embodiments, the stacked image sensor device further includes a second band-pass filter separated from the first substrate by the second substrate, the second band-pass filter including alternating layers of a third material having a third refractive index and a fourth material having a fourth refractive index that is less than the third refractive index. In some embodiments, the first band-pass filter has a different number of layers than the second band-pass filter. In some embodiments, the stacked image sensor device further includes a third substrate separated from the second substrate by the second band-pass filter, and a third image sensor element disposed within the third substrate and configured to generate electrical signals from electromagnetic radiation within a third range of wavelengths that is different than the first range of wavelengths and the second range of wavelengths. In some embodiments, the stacked image sensor device further includes a first dielectric structure arranged along the second surface of the first substrate and including a first plurality of stacked inter-level dielectric (ILD) layers surrounding a first plurality of conductive interconnect layers, and a second dielectric structure arranged along a surface of the second substrate and including a second plurality of stacked ILD layers surrounding a second plurality of conductive interconnect layers. In some embodiments, the first band-pass filter is arranged between sidewalls of the first dielectric structure. In some embodiments, the stacked image sensor device further includes a through-substrate-via (TSV) extending through the second substrate and electrically coupling the first plurality of conductive interconnect layers to the second plurality of conductive interconnect layers, the TSV extending through the first band-pass filter. In some embodiments, the first substrate has a first thickness and the second substrate has a second thickness that is greater than the first thickness.

In yet other embodiments, the present disclosure relates to a method of forming an three dimensional integrated chip. The method includes forming a first image sensor element within a first substrate, the first image sensor element configured to generate electrical signals from electromagnetic radiation within a first range of wavelengths; forming a second image sensor element within a second substrate, the second image sensor element configured to generate electrical signals from electromagnetic radiation within a second range of wavelengths; performing a plurality of deposition processes to form a first band-pass filter over the second substrate, the first band-pass filter having a plurality of alternating layers of a first material having a first refractive index and a second material having a second refractive index that is less than the first refractive index; and bonding the first substrate to the first band-pass filter.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A three-dimensional integrated chip, comprising:
   a first integrated chip (IC) die having a first image sensor element configured to generate electrical signals from electromagnetic radiation within a first range of wavelengths;
   a second IC die having a second image sensor element configured to generate electrical signals from electromagnetic radiation within a second range of wavelengths that is different than the first range of wavelengths;
   a first band-pass filter arranged between the first IC die and the second IC die and configured to reflect electromagnetic radiation that is within the first range of wavelengths; and
   a waveguide arranged over the first IC die, the waveguide having a bottom surface facing the first IC die and a top surface facing away from the first IC die, the bottom surface having a smaller width than the top surface.

2. The integrated chip of claim 1, further comprising:
   a second band-pass filter separated from the first IC die by the second IC die, wherein the second band-pass filter is configured to reflect electromagnetic radiation that is within the second range of wavelengths.

3. The integrated chip of claim 1, wherein the first band-pass filter comprises:
   a first layer of material having a first refractive index; and
   a second layer of material having a second refractive index that is less than the first refractive index.

4. The integrated chip of claim 1, wherein the first band-pass filter comprises:
   a first layer of silicon;
   a first layer of silicon dioxide; and
   a second layer of silicon, wherein the first layer of silicon dioxide continuously extends from a first surface contacting the first layer of silicon to a second surface contacting the second layer of silicon.

5. The integrated chip of claim 1, wherein the first IC die comprises:
   a first substrate; and
   a first dielectric structure comprising a plurality of stacked inter-level dielectric (ILD) layers surrounding a plurality of conductive interconnect layers.

6. The integrated chip of claim 5, wherein the first band-pass filter is arranged between the first dielectric structure and the second IC die.

7. The integrated chip of claim 6, further comprising:
   a dielectric waveguide arranged laterally between sidewalls of the first dielectric structure and vertically extending through the plurality of stacked ILD layers at a position overlying the first band-pass filter.

8. The integrated chip of claim 5, wherein the first band-pass filter is arranged between sidewalls of the first dielectric structure.

9. The integrated chip of claim 1, wherein the first band-pass filter is configured to pass electromagnetic radiation within a passband including the second range of wavelengths.

10. The integrated chip of claim 1,
    wherein the first IC die comprises a first substrate having a substantially planar first upper surface facing away from the second IC die; and
    wherein the second IC die comprises a second substrate having a second upper surface facing the first IC die, wherein the second upper surface comprises angled sidewalls defining one or more recesses within the second upper surface.

11. A stacked image sensor device, comprising:
    a first image sensor element disposed within a first substrate and configured to generate electrical signals from electromagnetic radiation within a first range of wavelengths, wherein the first substrate has a first surface configured to receive incident radiation and a second surface opposing the first surface;
    a second image sensor element disposed within a second substrate and configured to generate electrical signals from electromagnetic radiation within a second range of wavelengths that is different than the first range of wavelengths; and
    a first band-pass filter arranged between the second surface of the first substrate and the second substrate and comprising alternating layers of a first material having a first refractive index and a second material having a second refractive index that is different than the first refractive index, wherein the first band-pass filter is configured to pass electromagnetic radiation within the second range of wavelengths and to reflect electromagnetic radiation within the first range of wavelengths;
    a first dielectric structure arranged along the second surface of the first substrate and comprising a first plurality of stacked inter-level dielectric (ILD) layers surrounding a first plurality of conductive interconnect layers;
    a second dielectric structure arranged along a surface of the second substrate and comprising a second plurality of stacked ILD layers surrounding a second plurality of conductive interconnect layers; and
    a through-substrate-via (TSV) extending through the second substrate and electrically coupling the first plurality of conductive interconnect layers to the second plurality of conductive interconnect layers, wherein the TSV extends through the first band-pass filter.

12. The stacked image sensor device of claim 11, further comprising:
    a second band-pass filter separated from the first substrate by the second substrate, wherein the second band-pass filter comprises alternating layers of a third material having a third refractive index and a fourth material having a fourth refractive index that is less than the third refractive index.

13. The stacked image sensor device of claim 12, wherein the first band-pass filter has a different number of layers than the second band-pass filter.

14. The stacked image sensor device of claim 12, further comprising:
    a third substrate separated from the second substrate by the second band-pass filter; and
    a third image sensor element disposed within the third substrate and configured to generate electrical signals from electromagnetic radiation within a third range of wavelengths that is different than the first range of wavelengths and the second range of wavelengths.

15. The stacked image sensor device of claim 11, wherein the first band-pass filter is arranged between sidewalls of the first dielectric structure.

16. The stacked image sensor device of claim 11, wherein the first substrate has a first thickness and the second substrate has a second thickness that is greater than the first thickness.

17. A three-dimensional integrated chip, comprising:
    a first integrated chip (IC) die having a first image sensor element configured to generate electrical signals from electromagnetic radiation within a first range of wavelengths;

a second IC die having a second image sensor element configured to generate electrical signals from electromagnetic radiation within a second range of wavelengths that is different than the first range of wavelengths; and a first band-pass filter arranged between the first IC die and the second IC die and configured to reflect electromagnetic radiation that is within the first range of wavelengths, wherein the first band-pass filter comprises:

a first layer of silicon;

a first layer of silicon dioxide; and a second layer of silicon, wherein the first layer of silicon dioxide continuously extends from a first surface contacting the first layer of silicon to a second surface contacting the second layer of silicon.

18. The integrated chip of claim 1, wherein the waveguide is a dielectric material.

19. The integrated chip of claim 1, further comprising:
a dielectric layer arranged over the first IC die and laterally surrounding the waveguide, wherein the waveguide has a first index of refraction that is different than a second index of refraction of the dielectric layer.

20. The integrated chip of claim 1, further comprising:
a dielectric layer arranged over the first IC die and laterally surrounding the waveguide, wherein the waveguide extends from within the dielectric layer to a top surface of the dielectric layer.

* * * * *